US012701709B2

(12) United States Patent
Shin et al.

(10) Patent No.: US 12,701,709 B2
(45) Date of Patent: Aug. 4, 2026

(54) NON-VOLATILE MEMORY DEVICE

(71) Applicant: Samsung Electronics Co., Ltd.,
Suwon-si (KR)

(72) Inventors: Homoon Shin, Suwon-si (KR);
Jonghoon Park, Suwon-si (KR);
Juyoung Yang, Suwon-si (KR);
Jungseok Hwang, Suwon-si (KR);
Sunghoon Kim, Suwon-si (KR);
Pansuk Kwak, Seoul (KR); Ahreum Kim, Suwon-si (KR); Myunghun Lee,
Suwon-si (KR); Changyeon Yu,
Suwon-si (KR); Mookyu Bae, Suwon-si
(KR); Sungun Lee, Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 400 days.

(21) Appl. No.: 18/475,070

(22) Filed: Sep. 26, 2023

(65) Prior Publication Data

US 2024/0224522 A1 Jul. 4, 2024

(30) Foreign Application Priority Data

Dec. 30, 2022 (KR) ........................ 10-2022-0191038

(51) Int. Cl.
*H10B 43/27* (2023.01)
*H10B 41/27* (2023.01)
(Continued)

(52) U.S. Cl.
CPC ............. *H10B 43/27* (2023.02); *H10B 41/27*
(2023.02); *H10B 41/41* (2023.02); *H10B*
*43/40* (2023.02)

(58) Field of Classification Search
CPC ........ H10B 43/27; H10B 41/27; H10B 41/41;
H10B 43/40; H10B 41/10; H10B 43/10;
H10B 41/40; H10B 43/50; H10B 43/35
See application file for complete search history.

(56) References Cited

U.S. PATENT DOCUMENTS 7,446,362 B2 11/2008 Hidaka et al.
7,679,133 B2 3/2010 Son et al.
(Continued)

FOREIGN PATENT DOCUMENTS

CN 111312719 B 8/2021
CN 112331664 B 11/2021
(Continued)

OTHER PUBLICATIONS

Extended European Search Report dated Apr. 22, 2024 for European
Patent Application No. 23205637.4.
(Continued)

*Primary Examiner* — Mohammad A Rahman
(74) *Attorney, Agent, or Firm* — HARNESS, DICKEY &
PIERCE, P.L.C.

(57) ABSTRACT

A non-volatile memory device may include a memory cell
region and a peripheral circuit region positioned below the
memory cell region in the vertical direction. The memory
cell region may include a plurality of channel structures
extending in a vertical direction, a first metal layer over the
plurality of channel structures, a first capping layer over the
first metal layer, a first upper insulation layer over the first
capping layer, and at least one first dummy contact penetrat-
ing through the first capping layer. The first metal layer may
include a plurality of bit lines and at least one dummy bit
line. The bit lines may be respectively connected to the
plurality of channel structures. The at least one first dummy
contact may be on the at least one dummy bit line and may
(Continued)

provide a migration path for hydrogen ions in the first upper insulation layer.

20 Claims, 40 Drawing Sheets

(51) Int. Cl.
  *H10B 41/41*         (2023.01)
  *H10B 43/40*         (2023.01)

(56)                References Cited

U.S. PATENT DOCUMENTS

| | | | |
|---|---|---|---|
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,987,907 | B2 | 3/2015 | Kang et al. |
| 9,129,853 | B2 | 9/2015 | Nagai |
| 9,536,822 | B2 | 1/2017 | Summerfelt et al. |
| 9,991,126 | B2 | 6/2018 | Park et al. |
| 10,032,780 | B2 | 7/2018 | Cho et al. |
| 10,515,907 | B2 | 12/2019 | Fujita et al. |
| 10,559,569 | B2 | 2/2020 | Jang et al. |
| 10,607,935 | B2 | 3/2020 | Takekida |
| 11,011,209 | B2 | 5/2021 | Kim et al. |
| 11,456,335 | B2 | 9/2022 | Lim et al. |
| 2011/0233648 | A1 | 9/2011 | Seol et al. |
| 2021/0210505 | A1 | 7/2021 | Choi et al. |
| 2021/0358936 | A1 | 11/2021 | Takuma et al. |
| 2021/0375905 | A1 | 12/2021 | Hwang et al. |
| 2021/0407968 | A1 | 12/2021 | Kim et al. |
| 2022/0037352 | A1 | 2/2022 | Zhang et al. |
| 2022/0084909 | A1 | 3/2022 | Kinoshita |
| 2022/0375862 | A1* | 11/2022 | Kim ....................... H10B 43/10 |

FOREIGN PATENT DOCUMENTS

| | | |
|---|---|---|
| JP | 5733864 B2 | 6/2015 |
| KR | 101109028 B1 | 2/2012 |
| KR | 2018/0072901 A | 7/2018 |
| KR | 102434434 B1 | 8/2022 |

OTHER PUBLICATIONS

Ito S et al: "Limitation of post-metallization annealing due to hydrogen blocking effect of multilevel interconnect", VLSI Technology, 1998. Digest of Technical Papers. 1998 Symposium on Honolulu, HI, USA Jun. 9-11, 1998, New York, NY, USA, IEEE, US, Jun. 9, 1998 (Jun. 9, 1998), pp. 182-183, XP032384894, DOI: 10.1109/VLSIT.1998.689249 ISBN: 978-0-7803-4770-0 * the whole document *.

* cited by examiner

NON-VOLATILE MEMORY DEVICE

CROSS-REFERENCE TO RELATED APPLICATIONS

This application is based on and claims priority under 35 U.S.C. § 119 to Korean Patent Application No. 10-2022-0191038, filed on Dec. 30, 2022 in the Korean Intellectual Property Office, the disclosure of which is incorporated by reference herein in its entirety.

BACKGROUND

Inventive concepts relate to a memory device, and more particularly, to a 3-dimensional non-volatile memory device including memory cell arrays arranged in a vertical direction with respect to a peripheral circuit.

As one of various processes for improving the electrical characteristics of a semiconductor device, there is an alloying process for repairing defects in a semiconductor device through a heat treatment after supplying hydrogen in a process of fabricating a unit device or a metal wiring process. In response to demands for high capacity and miniaturization of memory devices, a 3-dimensional memory device in which memory cell arrays and peripheral circuits are arranged in a vertical direction has been developed. In the case of such a 3-dimensional memory device, most of a peripheral circuit region where the peripheral circuits are arranged overlaps a cell region where a memory cell array is disposed, and only a portion of the peripheral circuit region, e.g., an outer peripheral circuit, may not overlap the cell region. In the 3-dimensional memory device, since the size of the outer peripheral circuit may be smaller than that of the cell region, the amount of hydrogen supplied from the outer peripheral circuit to the cell region may decrease during an alloying process.

SUMMARY

Inventive concepts provide a non-volatile memory device capable of improving electrical characteristics of memory cells through smooth hydrogen injection into a cell region by securing a plurality of hydrogen migration paths into the cell region.

According to an embodiment of inventive concepts, a non-volatile memory device may include a memory cell region including a plurality of channel structures extending in a vertical direction, a first metal layer over the plurality of channel structures, a first capping layer over the first metal layer, a first upper insulation layer over the first capping layer, and at least one first dummy contact penetrating through the first capping layer; and a peripheral circuit region below the memory cell region in the vertical direction. The first metal layer may include a plurality of bit lines and at least one dummy bit line. The plurality of bit lines respectively may be connected to the plurality of channel structures. The at least one first dummy contact may be on the at least one dummy bit line and may provide a migration path for hydrogen ions in the first upper insulation layer.

According to an embodiment of inventive concepts, a non-volatile memory device may include a memory cell region including a plurality of channel structures extending in a vertical direction, a first metal layer over the plurality of channel structures, a first capping layer over the first metal layer, a first upper insulation layer over the first capping layer, at least one first contact, and at least one second contact; and a peripheral circuit region below the memory cell region in the vertical direction. The first metal layer may include a plurality of bit lines each extending in a first direction and spaced apart from one another in a second direction, a common source line tapping wire extending in the first direction and configured to have a common source line voltage applied thereto, and a node wire spaced apart from the common source line tapping wire in the first direction and configured to have a bias voltage applied thereto. The at least one first contact may be on the common source line tapping wire and may penetrate through the first capping layer. The at least one second contact may be on the node wire and may penetrate through the first capping layer. The at least one first contact and the at least one second contact may provide a migration path for hydrogen ions in the first upper insulation layer.

According to an embodiment of inventive concepts, a non-volatile memory device may include a memory cell region including a plurality of channel structures extending in a vertical direction, a first metal layer over the plurality of channel structures, a first capping layer over the first metal layer, a first upper insulation layer over the first capping layer, a second metal layer over the first upper insulation layer, vias, and a dummy via; and a peripheral circuit region below the memory cell region in the vertical direction. The vias may include a first via having a first height on the first metal layer and a second via having a second height between the first via and the second metal layer. The dummy via has the first height and may be on the first metal layer. The first via and the dummy via may penetrate through the first capping layer and provide a migration path for hydrogen ions in the first upper insulation layer.

According to an embodiment of inventive concepts, a non-volatile memory device may include a memory cell region including an upper substrate, a plurality of gate electrodes stacked on the upper substrate in a vertical direction, and a plurality of channel structures extending in the vertical direction on the upper substrate; and a peripheral circuit region below the memory cell region in the vertical direction. The peripheral circuit region may include a lower substrate, a first lower insulation layer on the lower substrate, a capping layer over the first lower insulation layer, and at least one via between the capping layer and the upper substrate. The at least one via may penetrate through the capping layer and may provide a migration path for hydrogen ions in the first lower insulation layer.

BRIEF DESCRIPTION OF THE DRAWINGS

Embodiments of inventive concepts will be more clearly understood from the following detailed description taken in conjunction with the accompanying drawings in which:

FIG. 2 is a circuit diagram showing a memory block according to an embodiment;

FIG. 24A is a circuit diagram showing a common source line driving circuit according to an embodiment.

FIG. 30 is a cross-sectional view of a memory device according to an embodiment;

FIG. 31 is a cross-sectional view of a memory device according to an embodiment;

FIG. 33 is a cross-sectional view of a memory device according to an embodiment;

DETAILED DESCRIPTION

Figure 1:
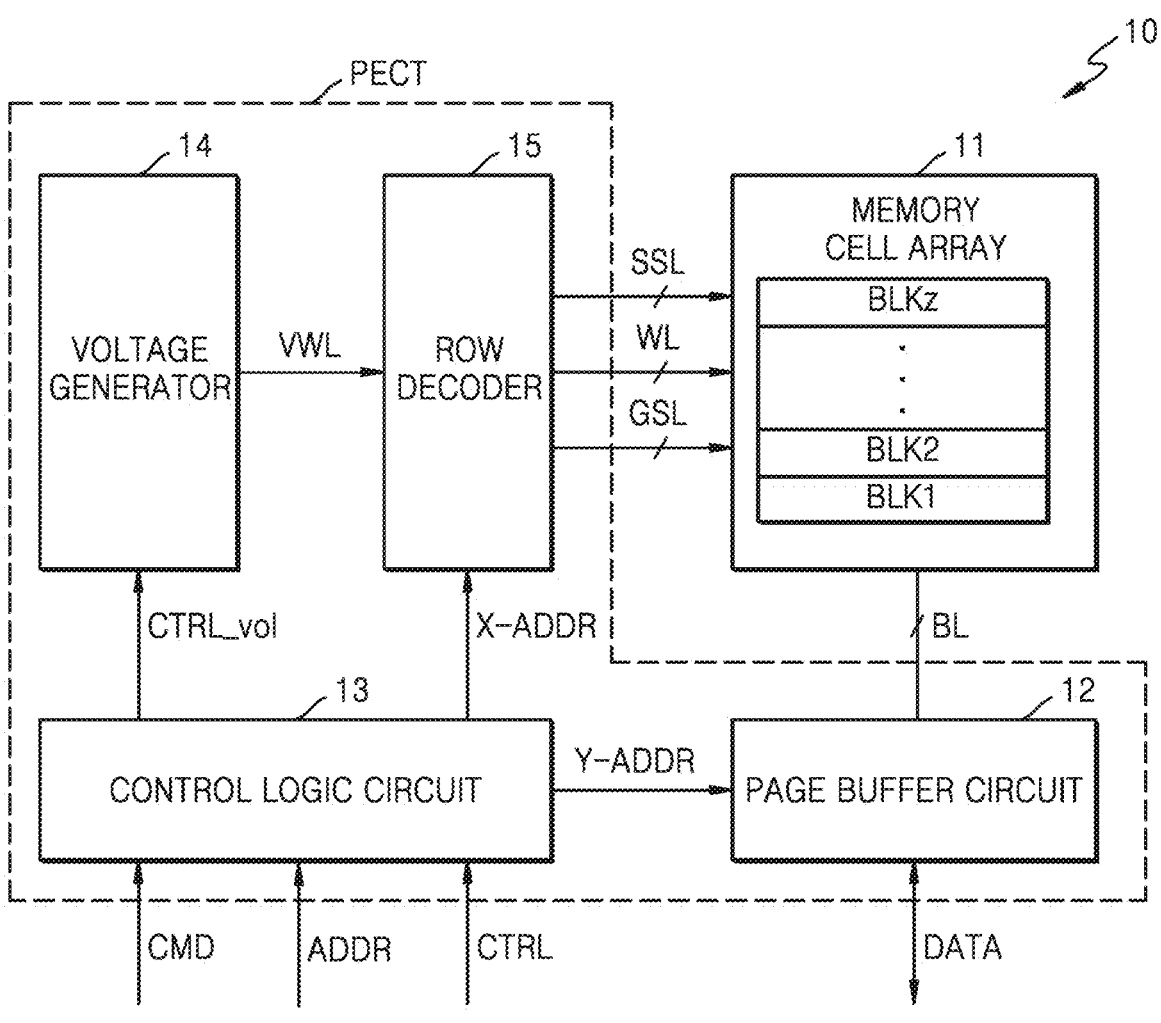
FIG. 1 is a block diagram showing a memory device according to an embodiment.

FIG. 1 is a block diagram showing the memory device 10 according to an embodiment.

Referring to FIG. 1, the memory device 10 may include a memory cell array 11 and a peripheral circuit PECT, wherein the peripheral circuit PECT may include a page buffer circuit 12, a control logic circuit 13, a voltage generator 14, and a row decoder 15. According to embodiments, the memory cell array 11 may be referred to as a "memory cell region" or a "cell region", and the peripheral circuit PECT may be referred to as a "peripheral circuit region". Although not shown in FIG. 1, the peripheral circuit PECT may further include a data input/output circuit, an input/output interface, etc. Also, the peripheral circuit PECT may further include a temperature sensor, a command decoder, an address decoder, etc. In the present specification, the memory device 10 may refer to a "non-volatile memory device".

The memory cell array 11 may include a plurality of memory blocks BLK1 to BLKz (z is a positive integer), and the plurality of memory blocks BLK1 to BLKz may each include a plurality of memory cells. The memory cell array 11 may be connected to the page buffer circuit 12 through bit lines BL and may be connected to the row decoder 15 through word lines WL, string select lines SSL, and ground select lines GSL. For example, memory cells may be flash memory cells. Hereinafter, embodiments will be described in detail based on an example case where the memory cells are NAND flash memory cells. However, inventive concepts is not limited thereto, and, according to some embodiments, the memory cells may be resistive memory cells like resistive random access memory (RAM) (ReRAM) cells, phase change RAM (PRAM) cells, and magnetic RAM (MRAM) cells.

In an embodiment, the memory cell array 11 may include a 3-dimensional memory cell array. The 3-dimensional memory cell array may include a plurality of NAND strings, and each NAND string may include memory cells respectively connected to word lines vertically stacked on a substrate. Detailed descriptions thereof will be given later with reference to FIG. 2. U.S. Pat. Nos. 7,679,133, 8,553, 466, 8,654,587, 8,559,235, and U.S. Patent Application Publication No. 2011/0233648, the disclosures of which are incorporated herein in their entirety by reference, disclose detailed suitable configurations for a 3-dimensional memory cell array including multiple levels and in which word lines and/or bit lines are shared between the levels. However, inventive concepts are not limited thereto. In some embodiments, the memory cell array 11 may include a 2-dimensional memory cell array, and the 2-dimensional memory cell array may include a plurality of NANDs arranged in a row-wise direction and a column-wise direction.

The page buffer circuit 12 may be connected to memory cells of the memory cell array 11 through the bit line BL. For example, the page buffer circuit 12 may select some bit lines from among the bit lines BL in response to a column address Y-ADDR received from the control logic circuit 13. A plurality of page buffers PB may each operate as a write driver or a sense amplifier. The control logic circuit 13 may output various control signals, e.g., a voltage control signal CTRL_vol, a row address X-ADDR, and a column address Y-ADDR, for programming data to the memory cell array 11, read data from the memory cell array 11, or erasing data stored in the memory cell array 11, based on a command CMD, an address ADDR, and a control signal CTRL. Therefore, the control logic circuit 13 may overall control various operations within the memory device 10.

The voltage generator 14 may generate a word line voltage VWL for performing a program operation, a read operation, and an erase operation on the memory cell array 11 based on the voltage control signal CTRL_Vol. Also, the voltage generator 14 may further generate a string select line voltage and a ground select line voltage based on the voltage control signal CTRL_Vol. The row decoder 15 may select one of the plurality of memory blocks BLK1 to BLKz in response to a row address X-ADDR received from the control logic circuit 130, select one of word lines WL of a selected memory block, and select one of the plurality of string select lines SSL.

Figure 3:
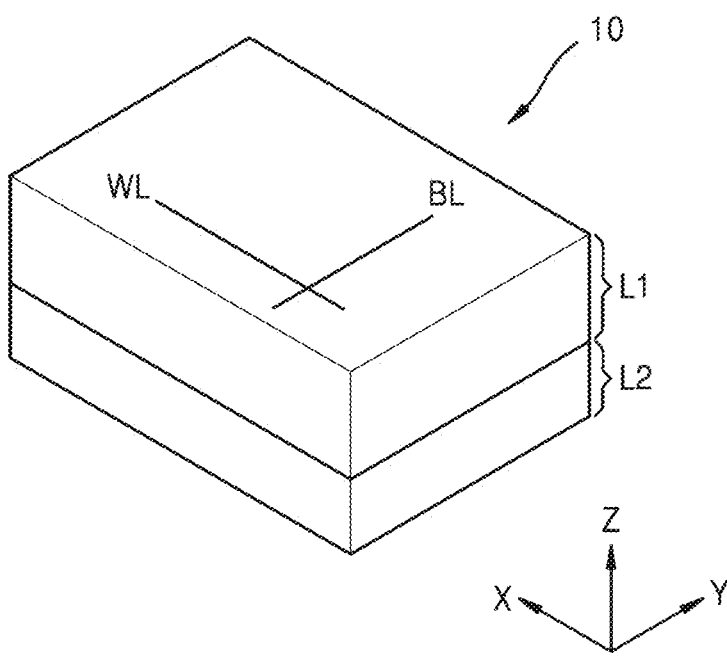
FIG. 3 is a diagram schematically showing the structure of a memory device according to an embodiment.
Figure 4A:
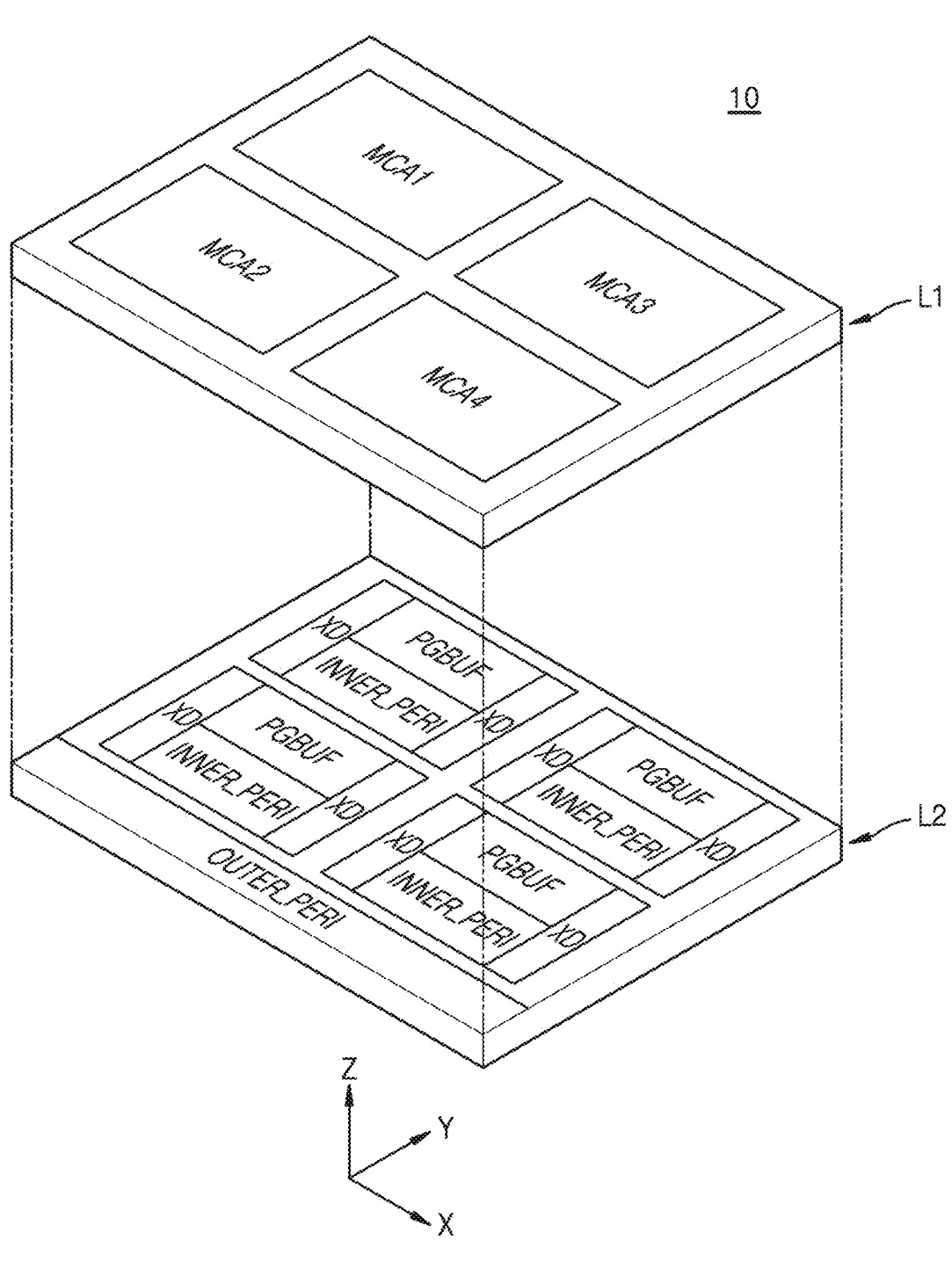
FIG. 4A is a diagram showing example configurations of a first semiconductor layer and a second semiconductor layer of FIG. 3, according to an embodiment.

According to an embodiment, the memory cell array 11 may be disposed in a first semiconductor layer (e.g., L1 of FIGS. 3 and 4A), and the peripheral circuit PECT may be disposed in a second semiconductor layer (e.g., L2 of FIGS. 3 and 4A). According to an embodiment, the memory cell array 11 may be disposed on a memory chip or a first semiconductor chip (e.g., CELL1 and CELL2 of FIG. 35), and the peripheral circuit PECT may be disposed on a peripheral circuit chip or a second semiconductor chip (e.g., PERI of FIG. 35). However, inventive concepts are not limited thereto, and, according to some embodiments, some of components included in the peripheral circuit PECT may be arranged on the first semiconductor layer or the first semiconductor chip together with the memory cell array 11. For example, a pass transistor circuit included in the row decoder 15 or some of components of the page buffer circuit 12 may be arranged on the first semiconductor layer or the first semiconductor chip.

Electrical characteristics of the memory device 10 may be deteriorated due to defects occurring in unit elements included in the memory device 10 during a manufacturing process, e.g., an oxidation process or a plasma etching process. For example, a dangling bond may be formed between a silicon oxide layer and a silicon substrate or between a gate oxide layer and a substrate interface of a unit element. As a result, leakage current may increase, and thus electrical characteristics of a semiconductor device may be deteriorated. In particular, a dangling bond may be formed in channel regions of memory cells, and thus, leakage current may increase.

To improve the electrical characteristics of the memory device 10 by repairing defects like a dangling bond, an alloying process of supplying hydrogen ions or hydrogen gas ($H_2$) to a cell region and annealing the cell region may be performed. To improve the efficiency of the alloying process, it is necessary to supply sufficient hydrogen to defective unit elements or to interfaces. In the case of a planar memory device in which a memory cell array and a peripheral circuit are arranged on the same plane, the size of a peripheral circuit region in which the peripheral circuit is disposed is sufficiently large as compared to a cell region in which the memory cell array is disposed, and sufficient hydrogen may be supplied to the cell region from an interlayer insulation layer of the peripheral circuit region. However, in the case of a COP memory device or a B-VNAND memory device in which the memory cell array 11 is disposed vertically above the peripheral circuit PECT as in embodiments of inventive concepts, the size of a portion of a peripheral circuit region not overlapping a cell region in a vertical direction is relatively very small, and thus it may be difficult for the cell region to receive sufficient hydrogen from an interlayer insulation layer of the peripheral circuit region. Also, in the case of a COP memory device or a B-VNAND memory device, since a heat budget is reduced after cell formation, it may be difficult to inject hydrogen into a cell region as compared to a planar memory device.

According to embodiments, an upper insulation layer included in the first semiconductor layer in which the memory cell array 11 is disposed may be implemented as a hydrogen-providing insulation layer, and hydrogen contained in the upper insulation layer may be supplied to the cell region through an alloying process. When hydrogen is implanted into memory cells through such a heat treatment process, impurities trapped in the memory cells may be removed, thereby improving cell characteristics. At this time, to limit and/or prevent defects due to diffusion of metal materials constituting a metal layer in the first semiconductor layer, a diffusion prevention layer or a capping layer formed to cover the top surface and/or the bottom surface of the metal layer may restrict the movement of hydrogen. According to embodiments, a plurality of hydrogen migration paths from a hydrogen-providing insulation layer to a cell region may be formed by forming a plurality of contact plugs or a plurality of dummy contact plugs penetrating through a capping layer. Various embodiments thereof will be described later with reference to FIGS. 2 to 29.

Also, according to embodiments, a lower insulation layer included in the second semiconductor layer in which the peripheral circuit PECT is disposed may be implemented as a hydrogen-providing insulation layer, and hydrogen contained in the lower insulation layer may be supplied to the cell region through an alloying process. When hydrogen is implanted into memory cells through such a heat treatment process, impurities trapped in the memory cells may be removed, thereby improving cell characteristics. Meanwhile, to limit and/or prevent defects due to diffusion of metal materials constituting a lower metal layer in the second semiconductor layer, a diffusion prevention layer or a capping layer formed to cover the top surface and/or the bottom surface of the lower metal layer may restrict the movement of hydrogen. According to embodiments, a plurality of hydrogen migration paths from a hydrogen-providing insulation layer to a cell region may be formed by forming a plurality of bypass vias penetrating through a capping layer. Various embodiments thereof will be described later with reference to FIGS. 30 to 34.

Figure 2:
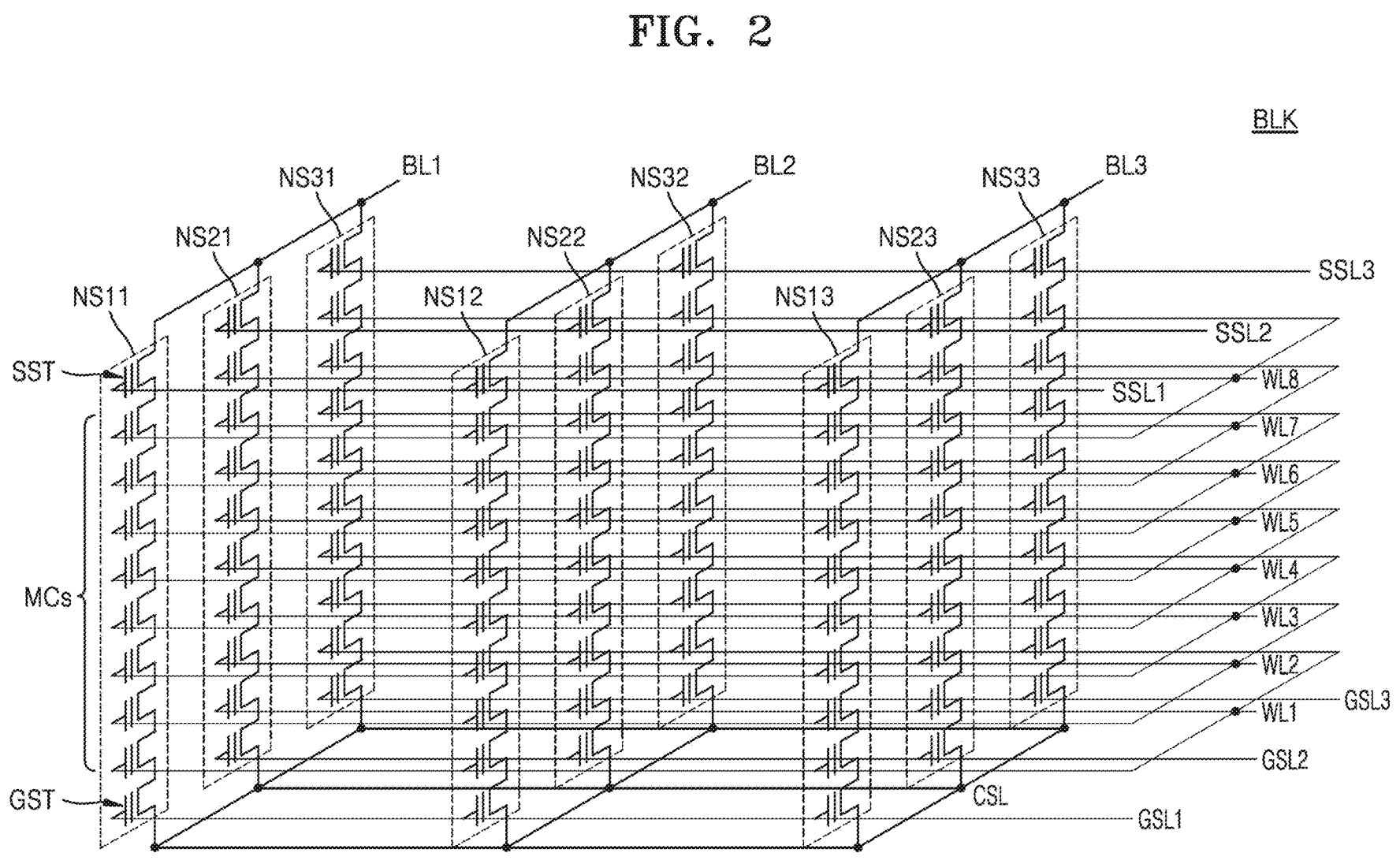

FIG. 2 is a circuit diagram showing a memory block BLK according to an embodiment.

Referring to FIG. 2, the memory block BLK may correspond to one of the memory blocks BLK1 to BLKz of FIG. 1. The memory block BLK may include NAND strings NS11 to NS33, and each NAND string (e.g., NS11) may include a string select transistor SST, a plurality of memory cells MCs, and a ground select transistor GST connected in series. The string select transistor SST, the ground select transistor GST, and the memory cells MCs included in each NAND string may form a stacked structure on a substrate in a vertical direction.

Bit lines BL1 to BL3 may extend in a first direction (e.g., the Y direction in FIG. 3), and word lines WL1 to WL8 may extend in a second direction (e.g., the X direction in FIG. 3). NAND strings NS11, NS21, and NS31 may be provided between a first bit line BL1 and a common source line CSL, NAND strings NS12, NS22, and NS32 may be provided between a second bit line BL2 and the common source line CSL, and NAND strings NS13, NS23, and NS33 may be provided between a third bit line BL3 and the common source line CSL.

The string select transistor SST may be coupled to corresponding string select lines SSL1 to SSL3. The memory cells MCs may be respectively connected to corresponding word lines WL1 to WL8. The ground select transistor GST may be coupled to corresponding ground select lines GSL1 to GSL3. The string select transistors SST may be respectively connected to a corresponding bit line BL, and the ground select transistor GST may be connected to the common source line CSL. Here, the number of NAND strings, the number of word lines, the number of bit lines, the number of ground select lines, and the number of string select lines may vary according to embodiments.

FIG. 3 is a diagram schematically showing the structure of the memory device 10 according to an embodiment.

Referring to FIGS. 1 and 3 together, the memory device 10 may include a first semiconductor layer L1 and a second semiconductor layer L2, and the first semiconductor layer L1 may be stacked in a vertical direction Z with respect to the second semiconductor layer L2. In detail, the second semiconductor layer L2 may be disposed below the first semiconductor layer L1 in the vertical direction Z. According to an embodiment, the memory cell array 11 may be formed in the first semiconductor layer L1, and the peripheral circuit PECT may be formed in the second semiconductor layer L2. Therefore, the memory device 10 may have a structure in which the memory cell array 11 is disposed above the peripheral circuit PECT, that is, a cell-over-periphery (COP) structure or a bonding VNAND (B-VNAND) structure. According to embodiments, the first semiconductor layer L1 may be referred to as a "memory cell region", and the second semiconductor layer L2 may be referred to as a "peripheral circuit region".

In the first semiconductor layer L1, the plurality of bit lines BL may extend in a first direction Y, and the plurality of word lines WL may extend in a second direction X. The second semiconductor layer L2 may include a lower substrate, and the peripheral circuit PECT may be formed in the second semiconductor layer L2 by forming semiconductor devices like transistors and patterns for distributing devices on the lower substrate.

According to an embodiment, when the memory device 10 has a COP structure, after the peripheral circuit PECT is formed in the second semiconductor layer L2, the first semiconductor layer L1 including the memory cell array 11 may be formed, and patterns for electrically connecting the word lines WL and bit lines BL of the memory cell array 11 to the peripheral circuit PECT formed in the second semiconductor layer L2 may be formed. According to an embodiment, when the memory device 10 has a B-VNAND structure, after the peripheral circuit PECT and bottom bonding pads are formed in the second semiconductor layer L2 and the memory cell array 11 and top bonding pads are formed in the first semiconductor layer L1, the top bonding pads on the first semiconductor layer L1 and the bottom bonding pads on the second semiconductor layer L2 may be connected to each other through bonding.

Figure 4B:
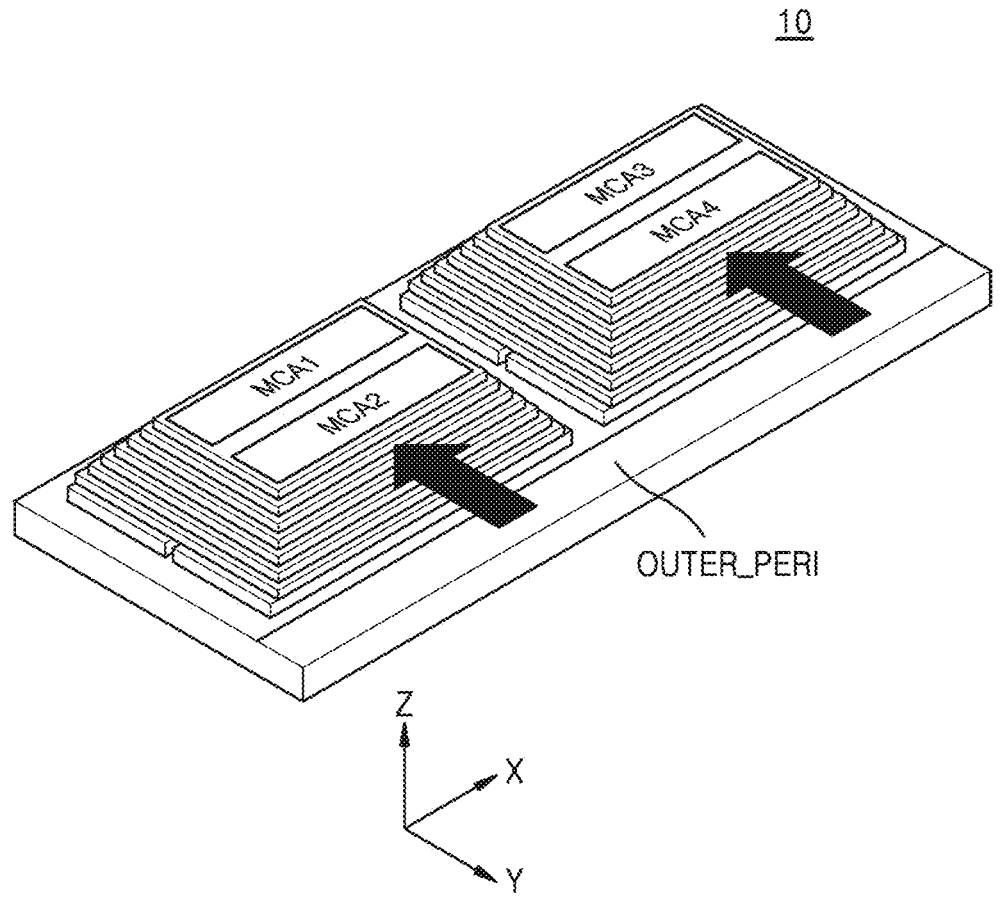
FIG. 4B is a perspective view of an example of the memory device of FIG. 4A according to an embodiment.

FIG. 4A is a diagram showing example configurations of the first semiconductor layer L1 and the second semiconductor layer L2 of FIG. 3, according to an embodiment. FIG. 4B is a perspective view of an example of the memory device 10 of FIG. 4A according to an embodiment.

Referring to FIGS. 4A and 4B together, the first semiconductor layer L1 may include memory cell arrays MCA1 to MCA4. The memory cell arrays MCA1 to MCA4 may each be referred to as a memory plane or MAT, and thus it may be stated that the memory device 10 has a 4-MAT structure. However, inventive concepts are not limited thereto, and the number of memory cell arrays included in the first semiconductor layer L1 may vary according to embodiments. The second semiconductor layer L2 may include a page buffer circuit PGBUF, row decoders XD, and an internal peripheral circuit INNER_PERI corresponding to each of the memory cell arrays MCA1 to MCA4. In this case, the page buffer circuit PGBUF, the row decoders XD, and the inner peripheral circuit INNER_PERI may overlap a corresponding memory cell array in the vertical direction Z.

Meanwhile, the second semiconductor layer L2 may further include an outer peripheral circuit OUTER_PERI, and the outer peripheral circuit OUTER_PERI may not overlap the memory cell arrays MCA1 to MCA4 in the vertical direction Z. In this case, through an alloying process or an annealing process, hydrogen ions included in an insulation layer of the outer peripheral circuit OUTER_PERI may move to a cell region in which the memory cell arrays MCA1 to MCA4 are arranged. However, since the size of the outer peripheral circuit OUTER_PERI is very small as compared to the cell region, it may be difficult to supply sufficient hydrogen to the cell region.

However, according to embodiments, hydrogen included in the upper insulation layer may be supplied to the memory cell arrays MCA1 to MCA4 by forming a plurality of dummy contacts or floating contacts on the upper metal layer in the cell region.

Figure 5:
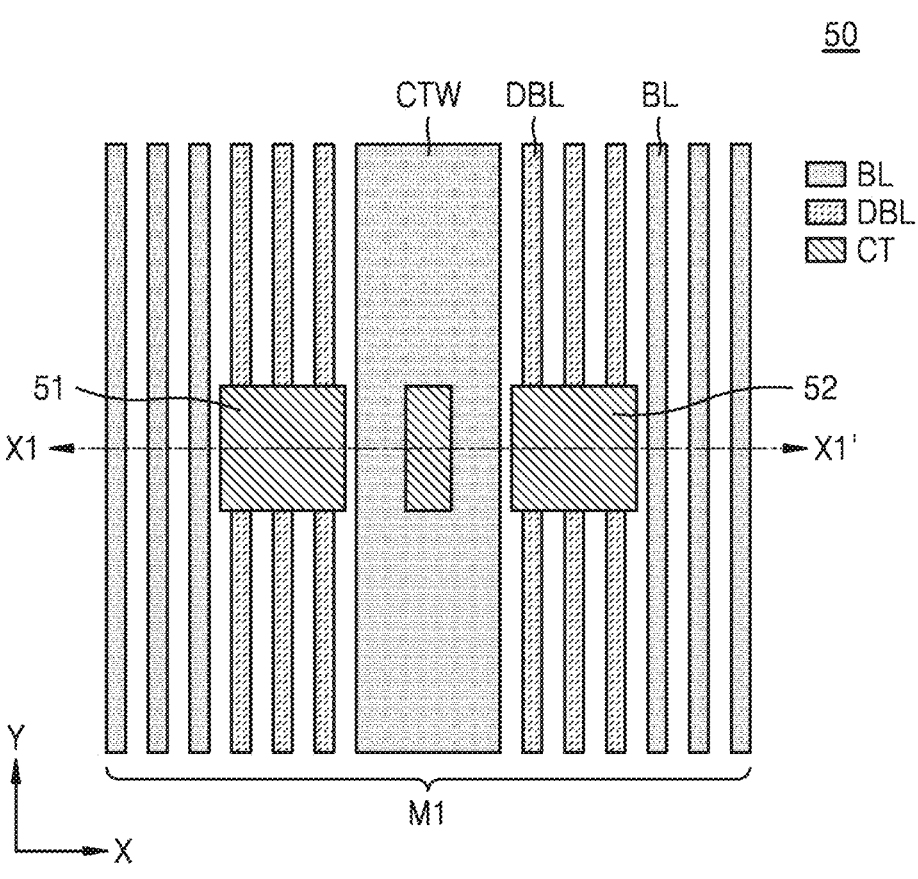
FIG. 5 is a plan view of a first metal layer of a memory device according to an embodiment.
Figure 6:
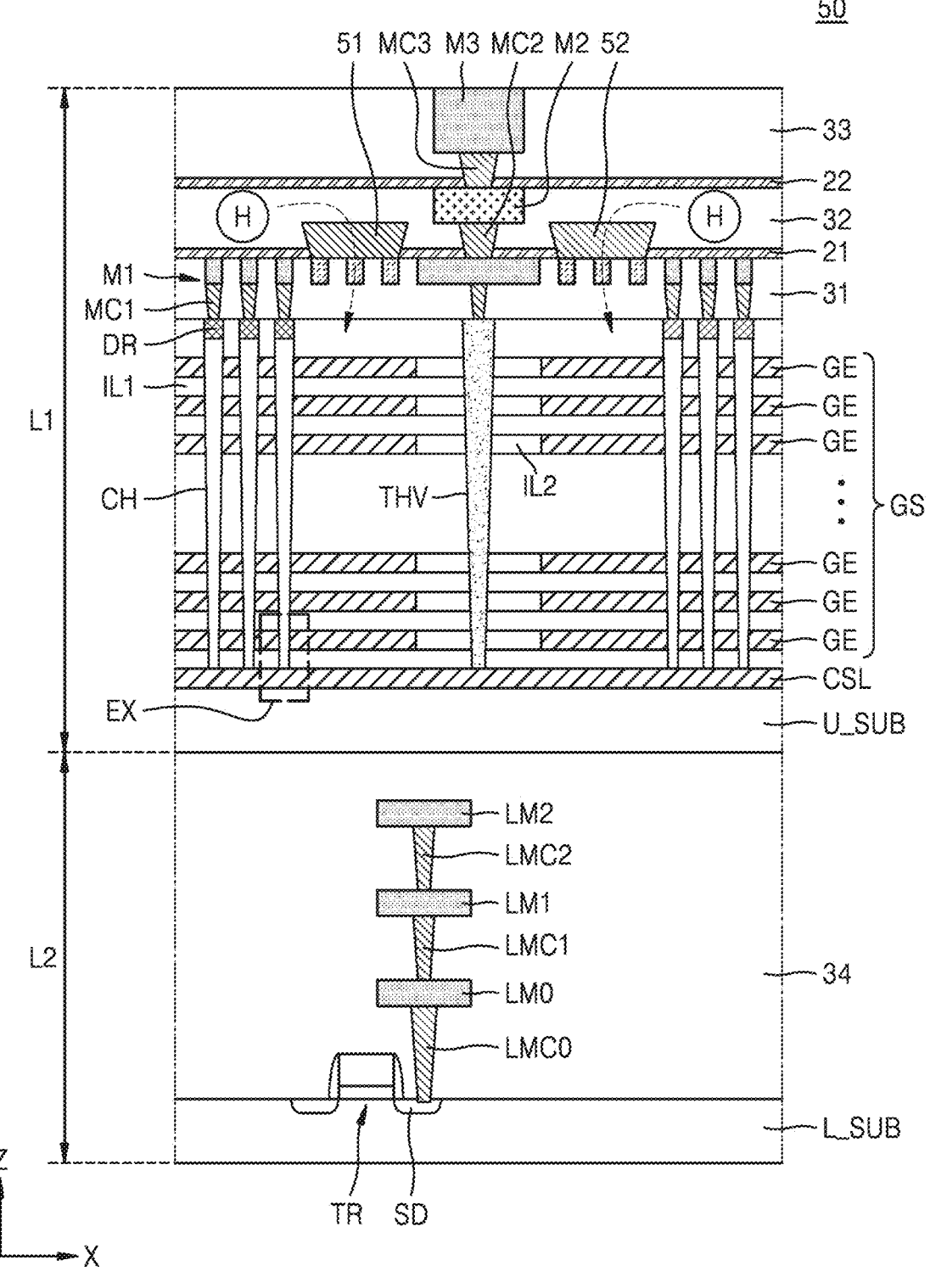
FIG. 6 is a cross-sectional view taken along a line X1-X1' of FIG. 5 according to an embodiment.

FIG. 5 is a plan view of a first metal layer M1 of a memory device 50 according to an embodiment. FIG. 6 is a cross-sectional view taken along a line X1-X1' of FIG. 5 according to an embodiment.

Referring to FIGS. 5 and 6 together, the memory device 50 may include the first semiconductor layer L1 and the second semiconductor layer L2 overlapping in a vertical direction Z. The first semiconductor layer L1 may include an upper substrate U_SUB, a common source line CSL, a gate structure GS, channel structures CH, a through electrode THV, insulation layers IL1 and IL2, first to third metal layers M1, M2, and M3, first to third contacts (being also referred as to first to third metal contacts) MC1, MC2, and MC3, first to third upper insulation layers 31, 32, and 33, a first capping layer 21, and a second capping layer 22. The second semiconductor layer L2 may include a lower substrate L_SUB, a circuit element TR, lower metal layers LM0, LM1, and LM2, lower metal contacts LMC0, LMC1, and LMC2, and a lower insulation layer 34. For example, the circuit element TR may correspond to a transistor included in a peripheral circuit (PECT of FIG. 1). For example, the lower metal layers LM0, LM1, and LM2 and the lower metal contacts LMC0, LMC1, and LMC2 may be connected to a source/drain SD of the circuit element TR, and thus a source/drain voltage may be provided to the circuit element TR.

The upper substrate U_SUB may include polysilicon, and the common source line CSL may be formed in a plate-like shape by implanting impurities into the upper substrate U_SUB. According to embodiments, it may be defined that the upper substrate U_SUB includes a plate-like common source line CSL. The gate structure GS may include a plurality of gate electrodes GE stacked in the vertical direction Z, and an insulation layer IL1 may be disposed between gate electrodes GE adjacent to each other. The channel structures CH may extend in the vertical direction Z on the upper substrate U_SUB or the common source line CSL.

The through electrode THV may extend in the vertical direction Z and may penetrate through the gate electrodes GE and the insulation layers IL1 and IL2. For example, the through electrode THV may be formed in an annular shape. However, inventive concepts are not limited thereto, and the through electrode THV may be formed in the form of an elliptical pillar or a quadrangular pillar. A common source line tapping wire CTW may be provided over the through electrode THV, and the common source line tapping wire CTW may be connected to the through electrode THV through a first metal contact MC1.

The first to third metal layers M1, M2, and M3 and the lower metal layers LM0, LM1, and LM2 may include a metal material, e.g., one selected from a group consisting of copper (Cu), aluminum (Al), tungsten (W), titanium (Ti), titanium nitride (TiN), tungsten nitride (WN), tantalum (Ta), tantalum nitride (TaN), and titanium-aluminum-nitride (TiAlN) or a combination thereof. The first to third contacts MC1, MC2, and MC3 and the lower metal contacts LMC0, LMC1, and LMC2 may each include a conductive material, e.g., doped polysilicon, aluminum (Al), tungsten (W), copper (Cu), titanium (Ti), etc.

According to the present embodiment, the memory device 50 may include the bit lines BL, dummy bit lines DBL, and the common source line tapping wire CTW, which extend in the first direction Y and are spaced apart from one another in the second direction X. According to an embodiment, the bit lines BL may be connected to the channel structures CH through corresponding first metal contacts MC1, respectively, and the dummy bit lines DBL may not be connected to the channel structures CH. Therefore, the dummy bit lines DBL may also be referred to as "floating bit lines". However, inventive concepts are not limited thereto, and, according to some embodiments, the dummy bit lines DBL may be connected to dummy channel structures.

According to an embodiment, the bit lines BL, the dummy bit lines DBL, and the common source line tapping wire CTW may be implemented as the first metal layer M1. In this case, the common source line tapping wire CTW may have a larger size, e.g., a larger width, in the second direction X as compared to the bit lines BL and the dummy bit lines DBL. The common source line tapping wire CTW may be connected to second and third metal layers M2 and M3 through second and third metal contacts MC2 and MC3, respectively, and a common source line voltage may be applied to the common source line tapping wire CTW. The dummy bit lines DBL may be arranged between the bit lines BL and the common source line tapping wire CTW, and the number of dummy bit lines DBL may vary according to embodiments.

The first capping layer 21 may be disposed on the first metal layer M1 and a first upper insulation layer 31, and the second capping layer 22 may be disposed on a second metal layer M2 and a second upper insulation layer 32. The first capping layer 21 and the second capping layer 22 may include silicon nitride, e.g., SiN. According to embodiment, the first capping layer 21 and the second capping layer 22 may also be referred to as barrier layers, barrier capping layers, or diffusion prevention layers. For example, the first capping layer 21 is a layer that limits and/or prevents diffusion of a metal material constituting the first metal layer M1 in a semiconductor device manufacturing process and may be formed to cover top surfaces of the first metal layer M1 and the first upper insulation layer 31. Also, for example, the second capping layer 22 is a layer that limits and/or prevents diffusion of a metal material constituting the second metal layer M2 in a semiconductor device manufacturing process and may be formed to cover top surfaces of the second metal layer M2 and the second upper insulation layer 32.

The second upper insulation layer 32 may include an insulating material containing hydrogen (H), e.g., tetraethyl orthosilicate (TEOS) $(Si(OC_2H_5)_4$, hydrogen silisesquioxane (HSQ), high density plasma chemical vapor (HDP CVD) oxide, etc. The second upper insulation layer 32 may provide hydrogen ions to the cell region through a heat treatment process, and thus, the second upper insulation layer 32 may be referred to as a "hydrogen-providing insulation layer". In this case, the first capping layer 21 and the second capping layer 22 may limit and/or prevent diffusion of hydrogen ions included in the second upper insulation layer 32.

According to the present embodiment, the memory device 50 may further include dummy contact plugs or dummy contacts 51 and 52 arranged on the dummy bit lines DBL. In this case, the dummy contacts 51 and 52 may not be connected to the second metal layer M2, and thus, the dummy contacts 51 and 52 may be referred to as "floating contacts". For example, the dummy contacts 51 and 52 may each overlap three dummy bit lines DBL, but inventive concepts are not limited thereto. The dummy contacts 51 and 52 may not be connected to gate structures GS and the channel structures CH and may not be connected to any transistor.

The dummy contacts 51 and 52 may penetrate through the first capping layer 21, thereby providing a hydrogen diffusion path or hydrogen migration path through which hydrogen ions included in the second upper insulation layer 32 are transferred to the cell region. In detail, the dummy contacts 51 and 52 may provide a hydrogen migration path by removing portions of the first capping layer 21. For example, hydrogen ions diffused through the hydrogen migration path may move to the channel structures CH through the gate electrodes GE and/or the insulation layer IL1. Through such a hydrogen migration path, hydrogen ions included in the second upper insulation layer 32 may be diffused toward the gate structure GS and the channel structure CH, thereby improving cell characteristics by removing a dangling bond in a channel region or limiting and/or preventing charge loss of a charge trapping layer. Therefore, the reliability of the memory device 50 may be improved.

Also, although not shown, the memory device 50 may further include the second metal layer M2 and a second metal contact MC2 for providing a voltage to the bit line BL included in the first metal layer M1, and the second metal contact MC2 may penetrate through the first capping layer 21 and interconnect the second metal layer M2 to the bit line BL. In this case, the second metal contact MC2 may penetrate through the first capping layer 21, thereby providing a hydrogen diffusion path or a hydrogen migration path through which hydrogen ions included in the second upper insulation layer 32 are transferred to the cell region. Through such a hydrogen migration path, hydrogen ions included in the second upper insulation layer 32 may diffuse toward the gate structure GS and the channel structure CH, thereby improving cell characteristics by removing a dangling bond in a channel region or limiting and/or preventing charge loss of a charge trapping layer. Therefore, the reliability of the memory device 50 may be improved. The channel structure CH may be connected to the first metal contact MC1 through a drain DR.

Figure 7:
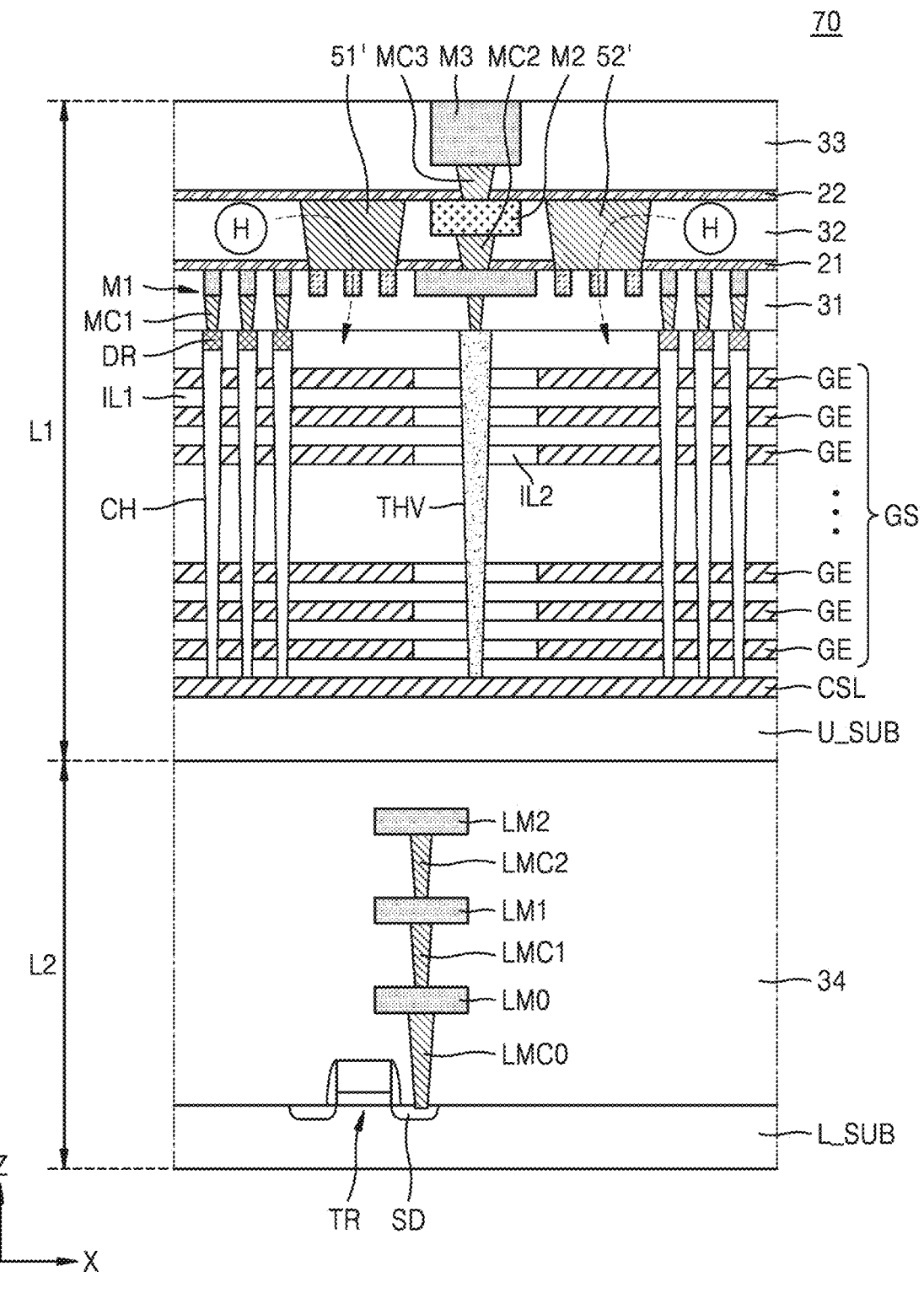
FIG. 7 is a cross-sectional view taken along a line X1-X1' of FIG. 5 according to an embodiment.

FIG. 7 is a cross-sectional view taken along a line X1-X1' of FIG. 5 according to an embodiment.

Referring to FIG. 7, a memory device 70 corresponds to a modified example of the memory device 50 of FIG. 6, and thus descriptions identical to those already given above will be omitted. The memory device 70 may include dummy contacts 51' and 52' arranged over the dummy bit lines DBL. The dummy contacts 51' and 52' may have greater heights in the vertical direction Z than the dummy contacts 51 and 52 of FIG. 6. For example, top surfaces of the dummy contacts 51' and 52' may contact the second capping layer 22. In this case, the dummy contacts 51' and 52' may penetrate through the first capping layer 21, thereby providing a hydrogen diffusion path or a hydrogen migration path through which hydrogen ions included in the second upper insulation layer 32 transfer to the cell region. Through such a hydrogen migration path, hydrogen ions included in the second upper insulation layer 32 may diffuse toward the gate structure GS and the channel structure CH, thereby improving cell characteristics by removing a dangling bond in a channel region or limiting and/or preventing charge loss of a charge trapping layer. Therefore, the reliability of the memory device 70 may be improved.

Figure 8:
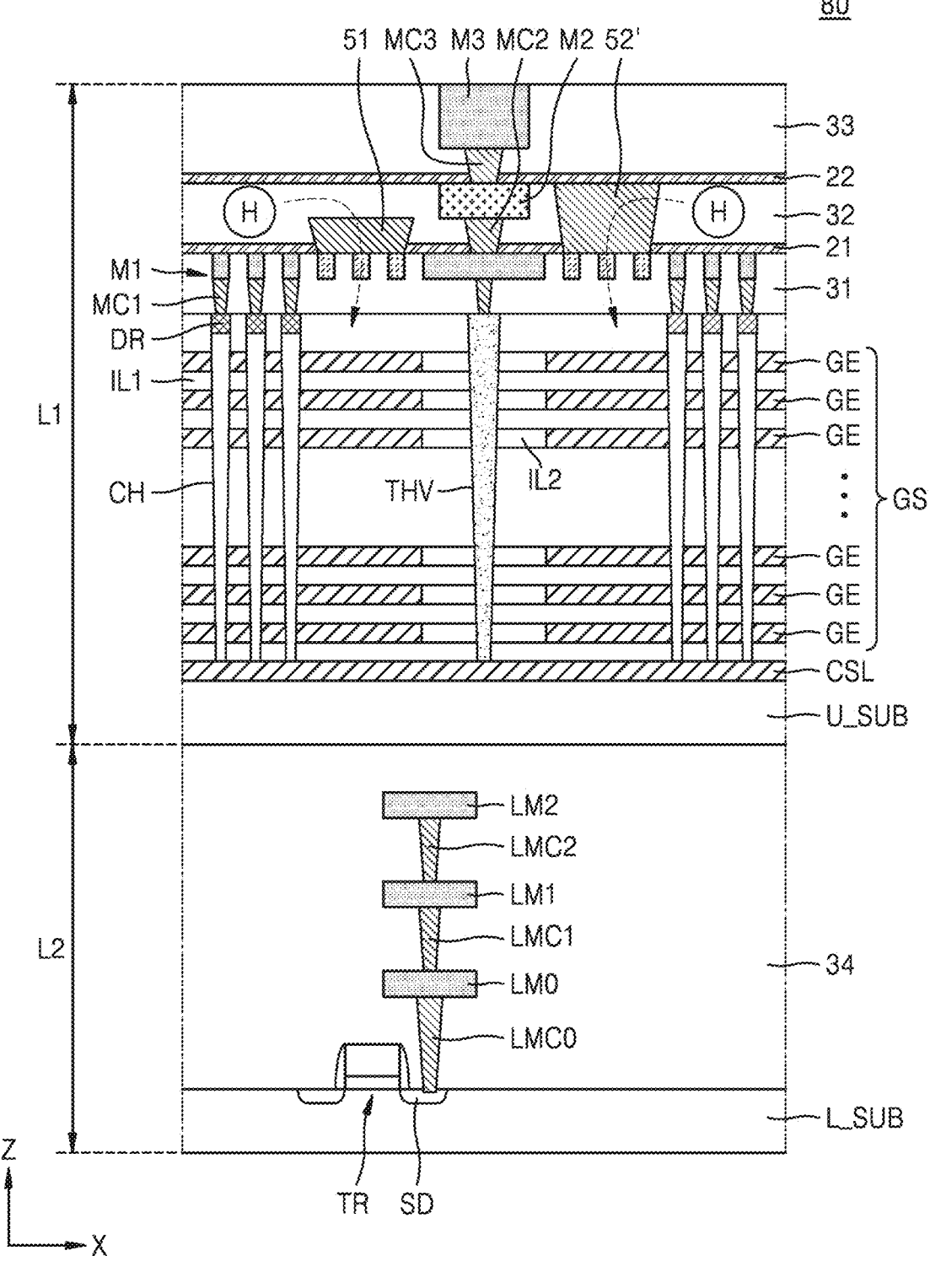
FIG. 8 is a cross-sectional view taken along a line X1-X1' of FIG. 5 according to an embodiment.

FIG. 8 is a cross-sectional view taken along a line X1-X1' of FIG. 5 according to an embodiment.

Referring to FIG. 8, a memory device 80 corresponds to a modified example of the memory device 50 of FIG. 6 and the memory device 70 of FIG. 7, and thus, descriptions identical to those already given above will be omitted. The memory device 80 may include dummy contacts 51 and 52' arranged over the dummy bit lines DBL. As such, the heights of the dummy contacts 51 and 52' in the vertical direction Z may be different from each other. The dummy contacts 51 and 52' may penetrate through the first capping layer 21, thereby providing a hydrogen diffusion path or a hydrogen migration path through which hydrogen ions included in the second upper insulation layer 32 transfer to the cell region. Through such a hydrogen migration path, hydrogen ions included in the second upper insulation layer 32 may diffuse toward the gate structure GS and the channel structure CH, thereby improving cell characteristics by removing a dangling bond in a channel region or limiting and/or preventing charge loss of a charge trapping layer. Therefore, the reliability of the memory device 80 may be improved.

Figure 9A:
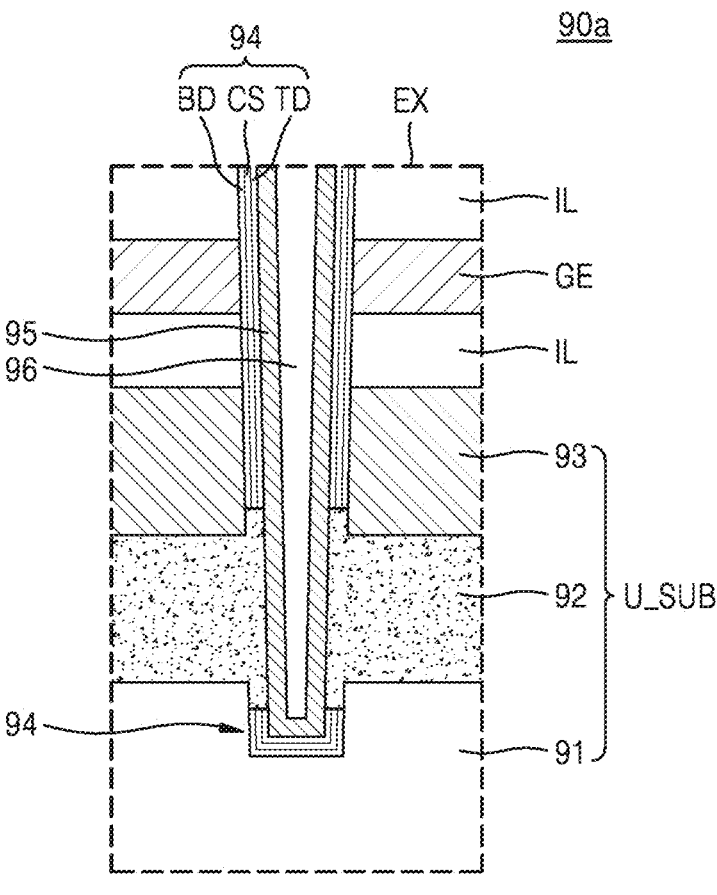
FIG. 9A is an enlarged cross-sectional view of some components included in a region indicated by "EX" in FIG. 6, according to an embodiment.

FIG. 9A is an enlarged cross-sectional view of some components included in a region "EX" in FIG. 6, according to an embodiment.

Referring to FIG. 9A, the upper substrate U_SUB of a memory device 90a may include a substrate 91, a first conductive plate 92, and a second conductive plate 93. The first conductive plate 92 and the second conductive plate 93 may function as common source lines CSL, and thus, it may be defined that the upper substrate U_SUB includes a flat plate-like common source line. The substrate 91 may include a semiconductor material like polysilicon. The first conductive plate 92 and the second conductive plate 93 may each include a doped polysilicon layer, a metal layer, or a combination thereof. For example, the metal layer may include tungsten (W) but is not limited thereto.

A gate dielectric layer 94 may include a tunneling dielectric layer TD, a charge storage layer CS, and a blocking dielectric layer BD sequentially formed from a channel region 95. According to embodiments, the charge storage layer CS may be referred to as a "charge trapping layer". Relative thicknesses of the tunneling dielectric layer TD, the charge storage layer CS, and the blocking dielectric layer BD are not limited to those shown in FIG. 9A and may vary.

The tunneling dielectric layer TD may include silicon oxide, hafnium oxide, aluminum oxide, zirconium oxide, tantalum oxide, etc. The charge storage layer CS is a region in which electrons that passed through the tunneling dielectric layer TD from a channel region 95 may be stored and may include silicon nitride, boron nitride, silicon boron nitride, or polysilicon doped with impurities. The blocking dielectric layer BD may include silicon oxide, silicon nitride, or a metal oxide having a higher permittivity than silicon oxide. The metal oxide may include hafnium oxide, aluminum oxide, zirconium oxide, tantalum oxide, or a combination thereof.

As shown in FIG. 9A, the first conductive plate 92 may penetrate through a portion of the gate dielectric layer 94 in a horizontal direction and contact the channel region 95. The thickness (size in the vertical direction) of a portion of the first conductive plate 92 vertically overlapping the gate dielectric layer 94 may be greater than the thickness (size in the vertical direction) of a portion of the first conductive plate 92 vertically overlapping the second conductive plate 93. The gate dielectric layer 94 may include a portion covering the sidewall of the channel region 95 at a level higher than that of the first conductive plate 92 and a portion covering the bottom surface of the channel region 95 at a level lower than that of the first conductive plate 92. The channel region 95 may be spaced apart from the substrate 91 with the lowest portion of the gate dielectric layer 94 therebetween. The sidewall of the channel region 95 may contact the first conductive plate 92 and be electrically connected to the first conductive plate 92.

The channel region 95 may have a cylindrical shape. The channel region 95 may include doped polysilicon or undoped polysilicon. A filling insulation layer 96 may fill the inner space of the channel region 95. The filling insulation layer 96 may include an insulating material. For example, the filling insulation layer 96 may include silicon oxide, silicon nitride, silicon oxynitride, or a combination thereof. According to some embodiments, the filling insulation layer 96 may be omitted. In this case, the channel region 95 may have a pillar-like structure without an inner space. The gate dielectric layer 94, the channel region 95, and the filling insulation layer 96 may constitute the channel structure CH.

Figure 9B:
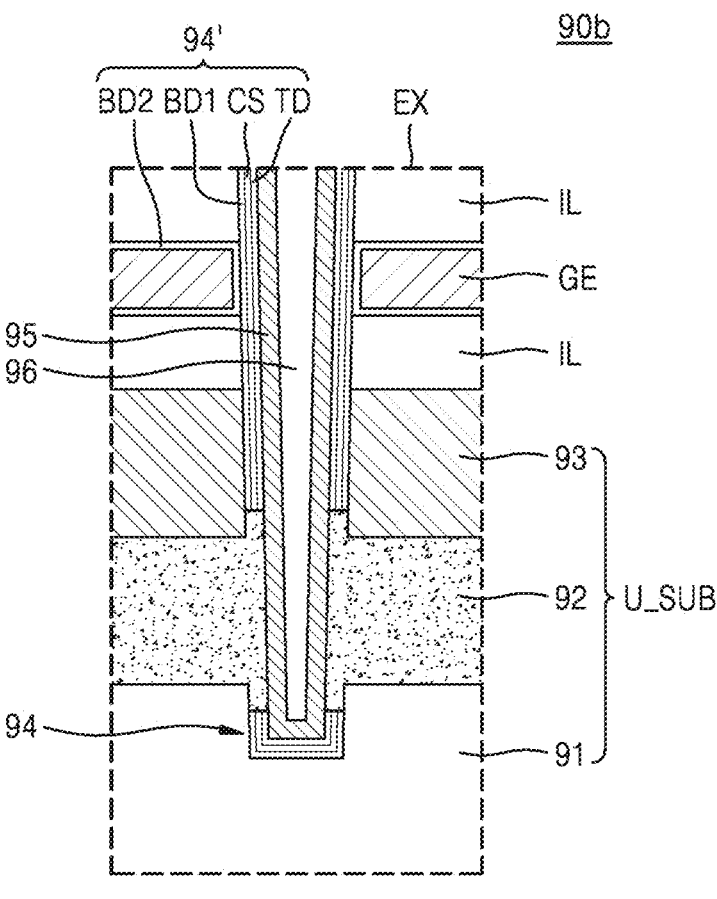
FIG. 9B is an enlarged cross-sectional view of some components included in a region indicated by "EX" in FIG. 6, according to an embodiment.

FIG. 9B is an enlarged cross-sectional view of some components included in a region "EX" in FIG. 6, according to an embodiment.

Referring to FIG. 9B, a memory device 90b corresponds to a modified example of the memory device 90a of FIG. 9A, and thus, descriptions identical to those already given above will be omitted. The memory device 90b may include a gate dielectric layer 94' instead of the gate dielectric layer 94. The gate dielectric layer 94' may have substantially the same configuration as the gate dielectric layer 94 except that the gate dielectric layer 94' includes a first blocking dielectric layer BD1 and a second blocking dielectric layer BD2 instead of the blocking dielectric layer BD. The first blocking dielectric layer BD1 may extend parallel to the channel region 95, and the second blocking dielectric layer BD2 may be disposed to surround the gate electrode GE. The first blocking dielectric layer BD1 and the second blocking dielectric layer BD2 may each include silicon oxide, silicon nitride, or a metal oxide. For example, the first blocking dielectric layer BD1 may include silicon oxide, and the second blocking dielectric layer BD2 may include a metal oxide having a higher permittivity than the silicon oxide layer. The metal oxide may include hafnium oxide, aluminum oxide, zirconium oxide, tantalum oxide, or a combination thereof.

Figure 10:
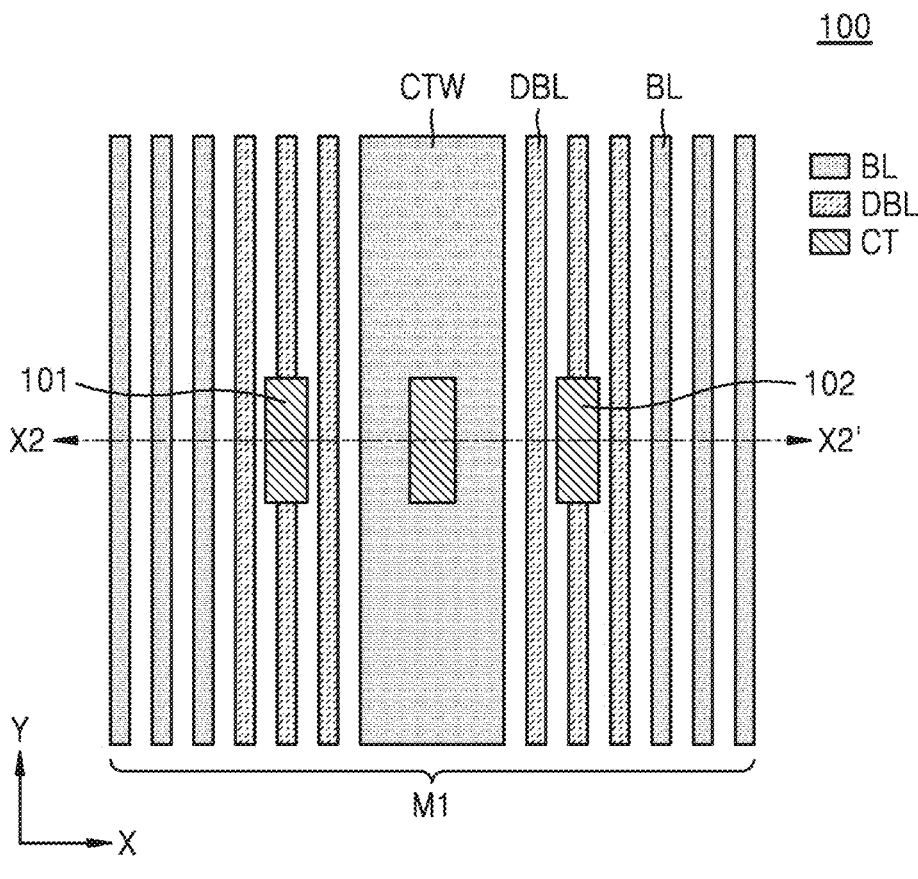
FIG. 10 is a plan view of a first metal layer of a memory device according to an embodiment.
Figure 11:
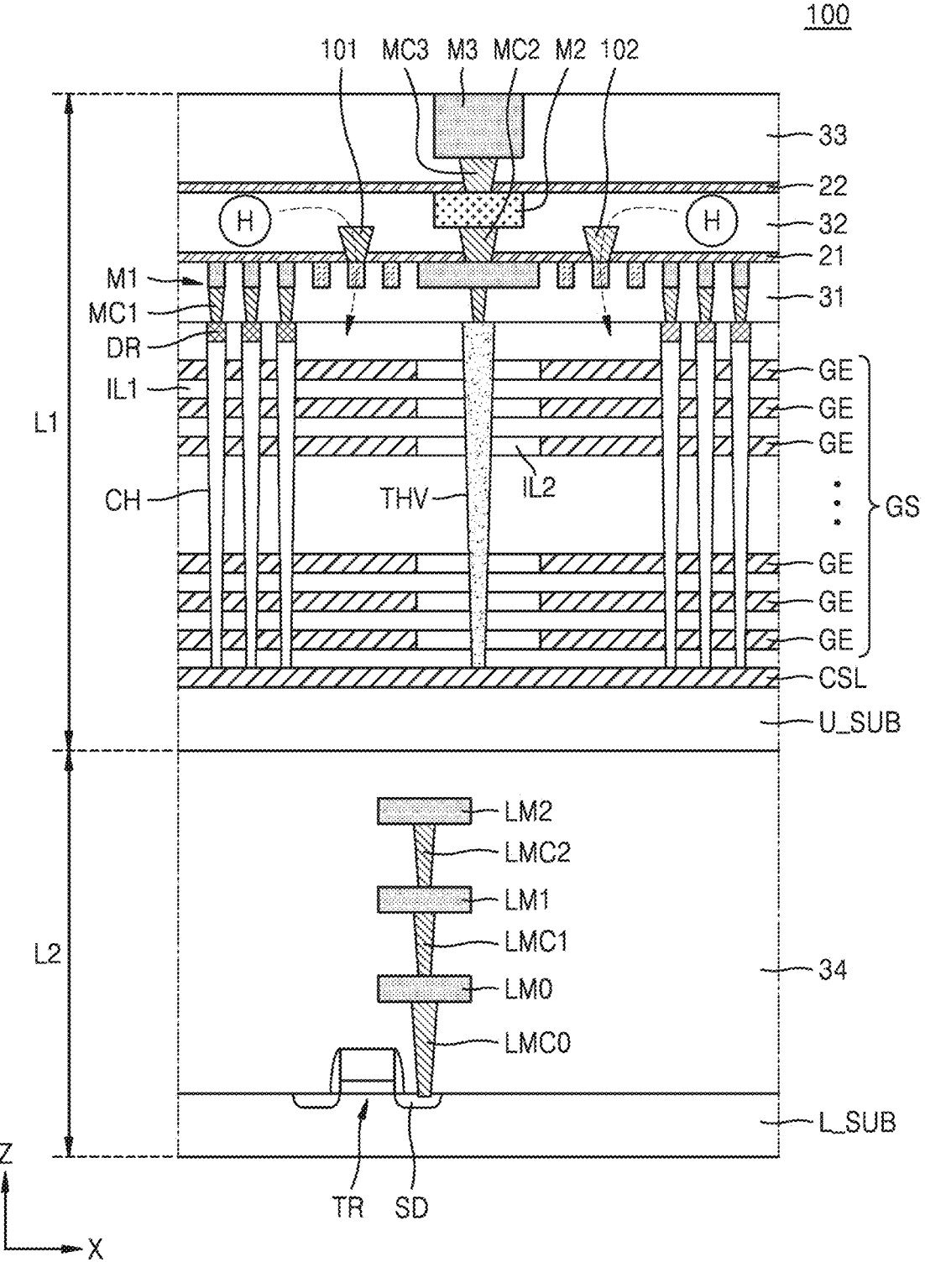
FIG. 11 is a cross-sectional view taken along a line X2-X2' of FIG. 10 according to an embodiment.

FIG. 10 is a plan view of the first metal layer M1 of a memory device 100 according to an embodiment. FIG. 11 is a cross-sectional view taken along a line X2-X2' of FIG. 10 according to an embodiment.

Referring to FIGS. 10 and 11 together, the memory device 100 corresponds to a modified example of the memory device 50 of FIGS. 5 and 6, and descriptions given above with reference to FIGS. 5 to 9B may also be applied to the present embodiment. According to the present embodiment, the memory device 100 may further include dummy contact plugs or dummy contacts 101 and 102 respectively arranged on the dummy bit lines DBL. In this case, the dummy contacts 101 and 102 may not be connected to the second metal layer M2, and thus, the dummy contacts 101 and 102 may be referred to as "floating contacts". For example, the dummy contacts 101 and 102 may each overlap one dummy bit line DBL, but inventive concepts are not limited thereto.

The dummy contacts 101 and 102 may penetrate through the first capping layer 21, thereby providing a hydrogen diffusion path or a hydrogen migration path through which hydrogen ions included in the second upper insulation layer 32 transfer to the cell region. Through such a hydrogen migration path, hydrogen ions in the second upper insulation layer 32 may diffuse toward the gate structure GS and the channel structure CH, thereby improving cell characteristics by removing a dangling bond in a channel region or limiting and/or preventing charge loss of a charge storage layer. Therefore, the reliability of the memory device 100 may be improved.

Figure 12:
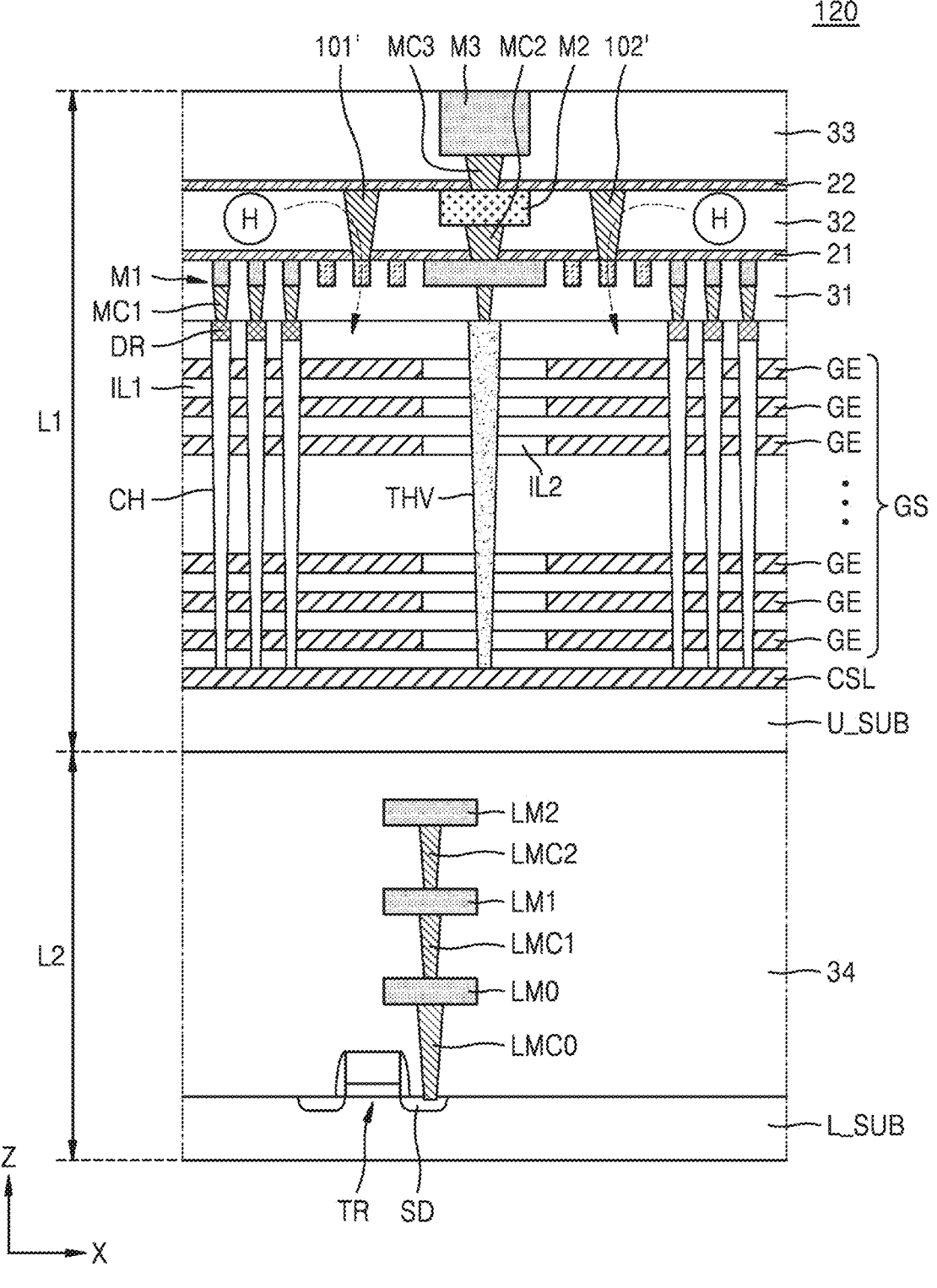
FIG. 12 is a cross-sectional view taken along a line X2-X2' of FIG. 10 according to an embodiment.

FIG. 12 is a cross-sectional view taken along a line X2-X2' of FIG. 10 according to an embodiment.

Referring to FIG. 12, a memory device 120 corresponds to a modified example of the memory device 100 of FIG. 11, and thus, descriptions identical to those already given above will be omitted. The memory device 120 may include dummy contacts 101' and 102' arranged over the dummy bit lines DBL, respectively. The dummy contacts 101' and 102' may have greater heights in the vertical direction Z than the dummy contacts 101 and 102 of FIG. 11. For example, top surfaces of the dummy contacts 101' and 102' may contact the second capping layer 22. The dummy contacts 101' and 102' may penetrate through the first capping layer 21, thereby providing a hydrogen diffusion path or a hydrogen migration path through which hydrogen ions in the second upper insulation layer 32 transfer to the cell region. Through such a hydrogen migration path, hydrogen ions in the second upper insulation layer 32 may diffuse toward the gate structure GS and the channel structure CH, thereby improving cell characteristics by removing a dangling bond in a channel region or preventing charge loss of a charge trapping layer. Therefore, the reliability of the memory device 120 may be improved.

Figure 13:
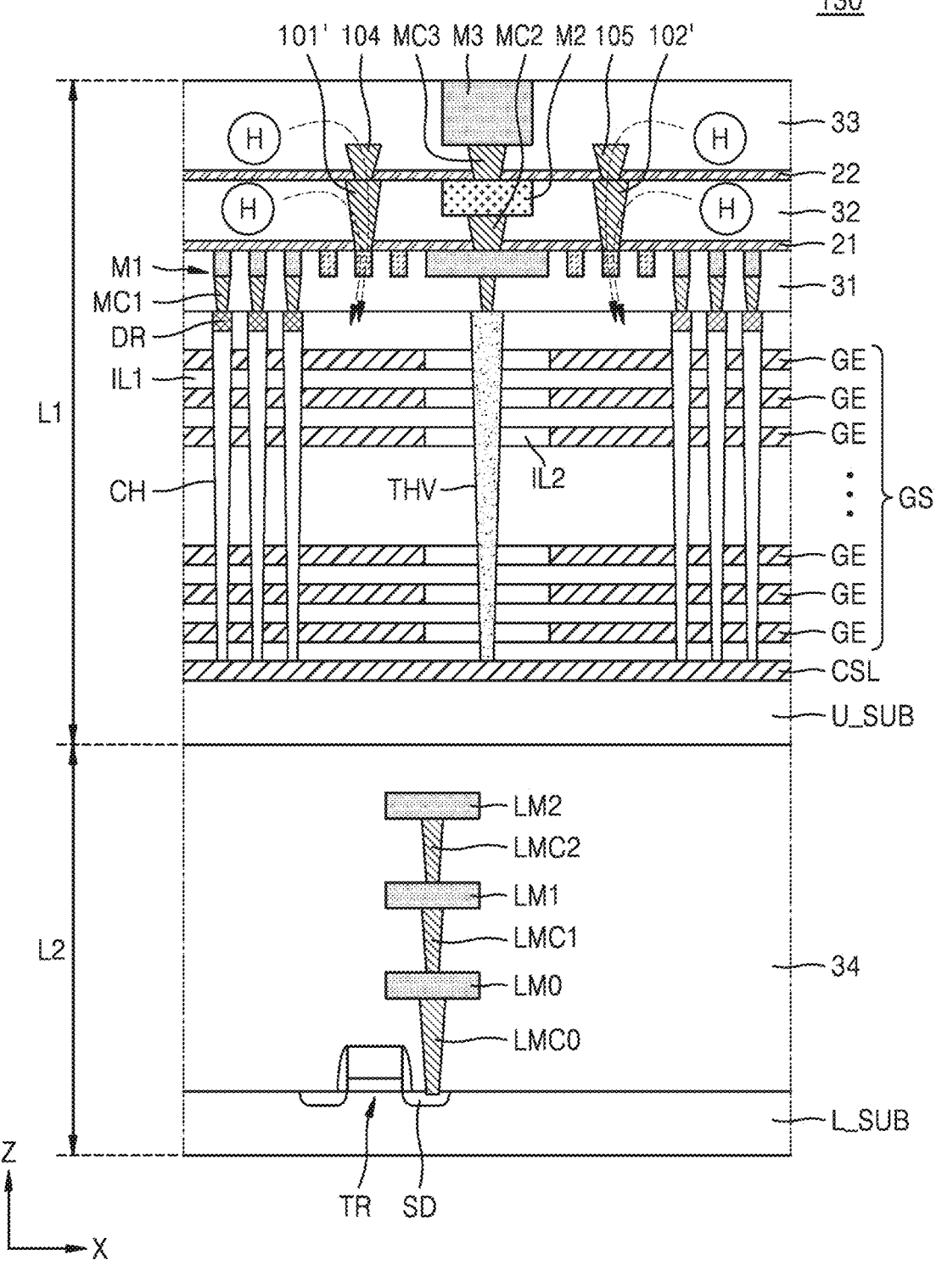
FIG. 13 is a cross-sectional view taken along a line X2-X2' of FIG. 10 according to an embodiment.

FIG. 13 is a cross-sectional view taken along a line X2-X2' of FIG. 10 according to an embodiment.

Referring to FIG. 13, a memory device 130 corresponds to a modified example of the memory device 120 of FIG. 12, and thus, descriptions identical to those already given above will be omitted. The memory device 130 may include dummy contacts 101' and 102' arranged over the dummy bit lines DBL, respectively, and may further include dummy contacts 104 and 105 arranged over the dummy contacts 101' and 102', respectively. For example, the dummy contacts 104 and 105 may have a smaller height in the vertical direction Z as compared to the dummy contacts 101' and 102', but inventive concepts are not limited thereto. The dummy contacts 104 and 105 may penetrate through the second capping layer 22, thereby providing a hydrogen diffusion path or a hydrogen migration path through which hydrogen ions in a third upper insulation layer 33 transfer to the cell region. Through such a hydrogen migration path, hydrogen ions in the third upper insulation layer 33 may diffuse toward the gate structure GS and the channel structure CH, thereby improving cell characteristics by removing a dangling bond in a channel region or preventing charge loss of a charge trapping layer. Therefore, the reliability of the memory device 130 may be improved.

Figure 14:
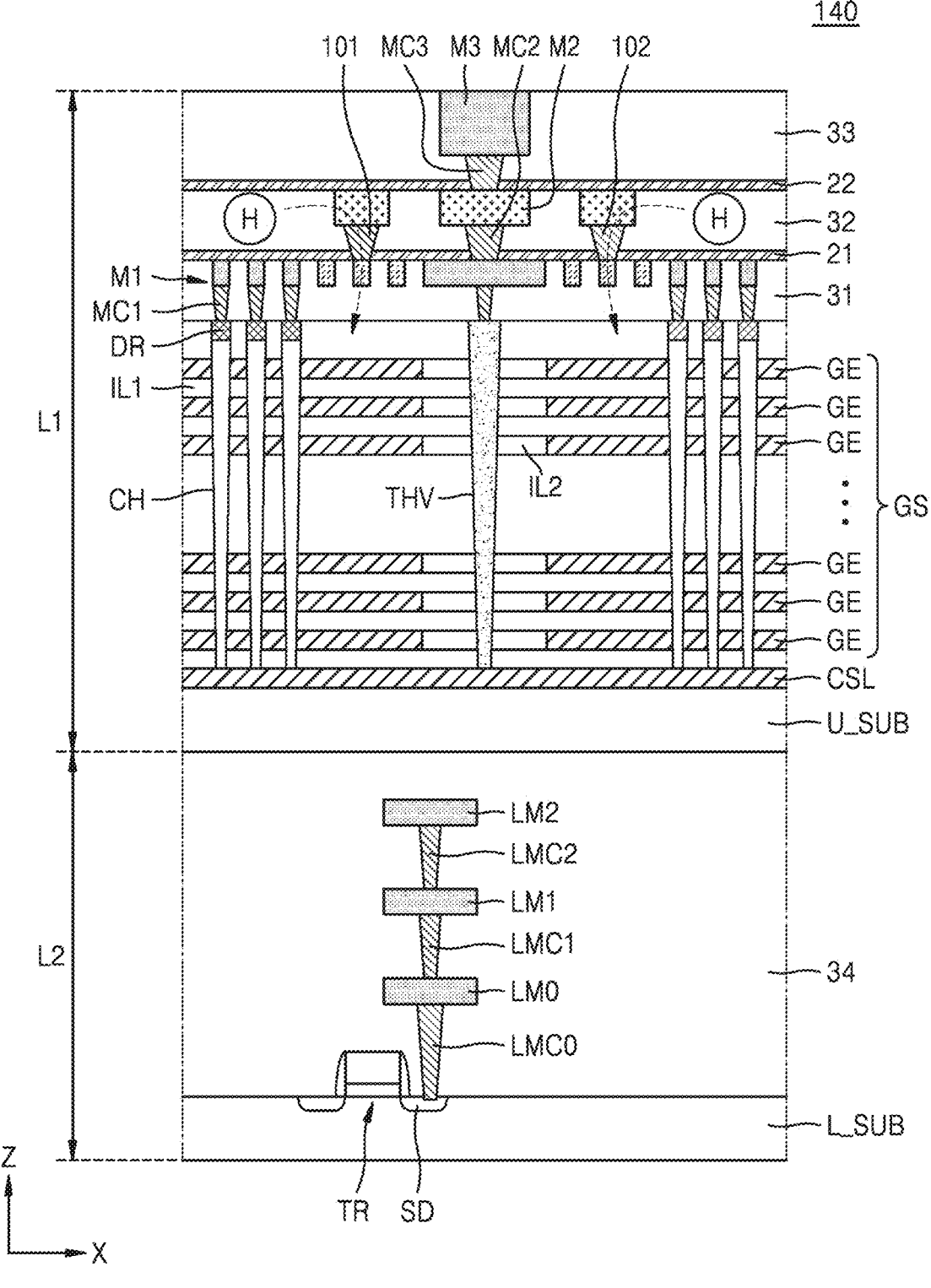
FIG. 14 is a cross-sectional view taken along a line X2-X2' of FIG. 10 according to an embodiment.

FIG. 14 is a cross-sectional view taken along a line X2-X2' of FIG. 10 according to an embodiment.

Referring to FIG. 14, a memory device 140 corresponds to a modified example of the memory device 100 of FIG. 11, and thus, descriptions identical to those already given above will be omitted. The memory device 140 may further include the second metal layer M2 disposed over the dummy contacts 101 and 102, and the dummy contacts 101 and 102 may be connected to the second metal layer M2. In this case, the second metal layer M2 over the dummy contacts 101 and 102 may not be electrically connected to an upper metal layer, and thus, the dummy bit lines DBL, the dummy contacts 101 and 102, and the second metal layer M2 connected to one another may constitute a floating node.

The dummy contacts 101 and 102 and the second metal layer M2 may provide a hydrogen diffusion path or a hydrogen migration path through which hydrogen ions in the second upper insulation layer 32 transfer to the cell region. Through such a hydrogen migration path, hydrogen ions in the second upper insulation layer 32 may diffuse toward the gate structure GS and the channel structure CH, thereby improving cell characteristics by removing a dangling bond in a channel region or preventing charge loss of a charge trapping layer. Therefore, the reliability of the memory device 140 may be improved.

Figure 15:
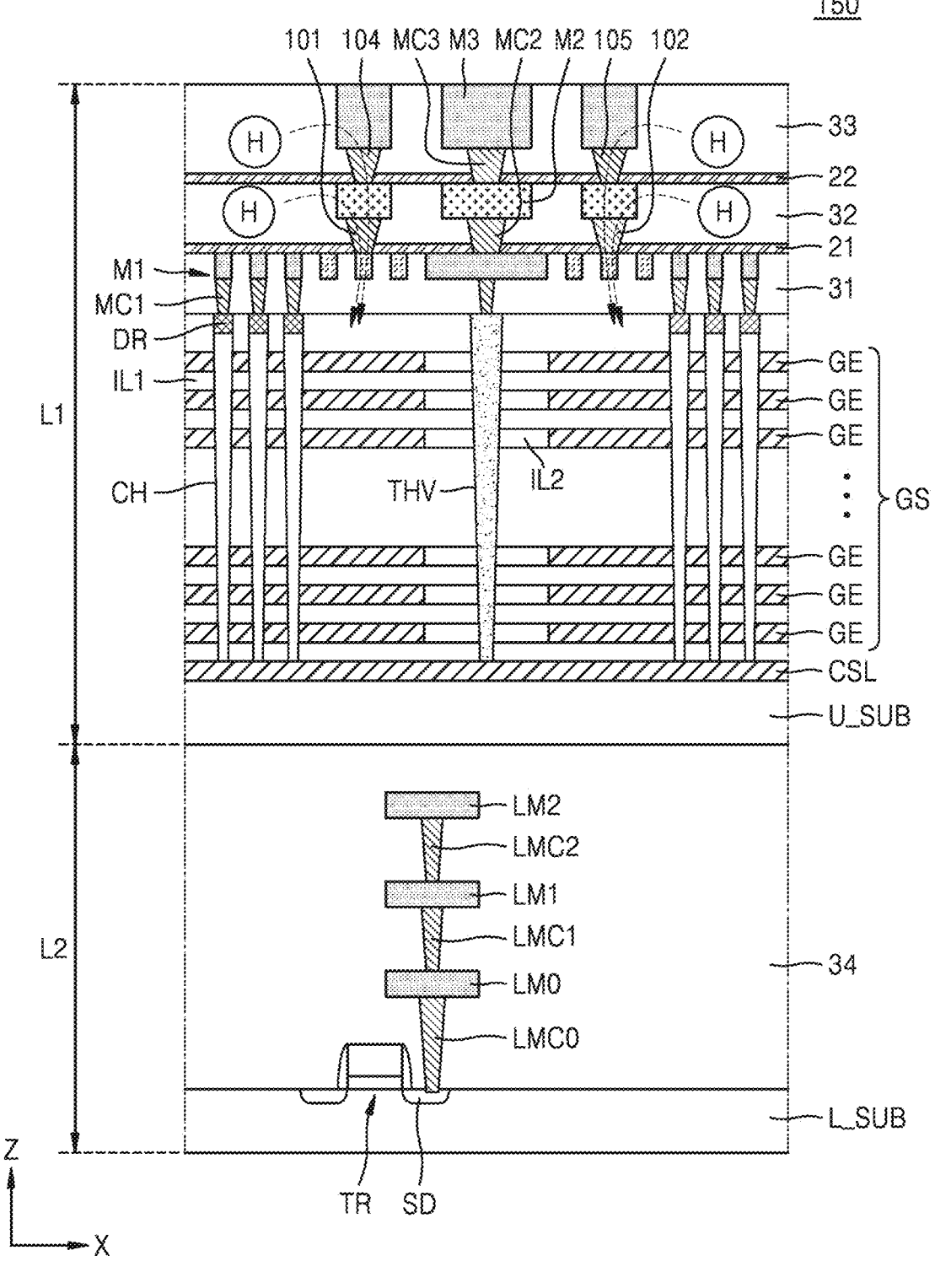
FIG. 15 is a cross-sectional view taken along a line X2-X2' of FIG. 10 according to an embodiment.

FIG. 15 is a cross-sectional view taken along a line X2-X2' of FIG. 10 according to an embodiment.

Referring to FIG. 15, a memory device 150 corresponds to a modified example of the memory device 140 of FIG. 14, and thus, descriptions identical to those already given above will be omitted. The memory device 150 may further include the dummy contacts 104 and 105 arranged over the second metal layer M2 and a third metal layer M3 disposed over the dummy contacts 104 and 105, and the dummy contacts 104 and 105 may be connected to the third metal layer M3. In this case, the third metal layer M3 over the dummy contacts 104 and 105 may not be electrically connected to an upper metal layer, and thus, the dummy bit lines DBL, the dummy contacts 101 and 102, the second metal layer M2, the dummy contacts 104 and 105, and the third metal layer M3 connected to one another may constitute a floating node.

The dummy contacts 104 and 105 and the third metal layer M3 may provide a hydrogen diffusion path or a hydrogen migration path through which hydrogen ions in the third upper insulation layer 33 transfer to the cell region. Through such a hydrogen migration path, hydrogen ions in the third upper insulation layer 33 may diffuse toward the gate structure GS and the channel structure CH, thereby improving cell characteristics by removing a dangling bond in a channel region or preventing charge loss of a charge trapping layer. Therefore, the reliability of the memory device 150 may be improved.

Figure 16:
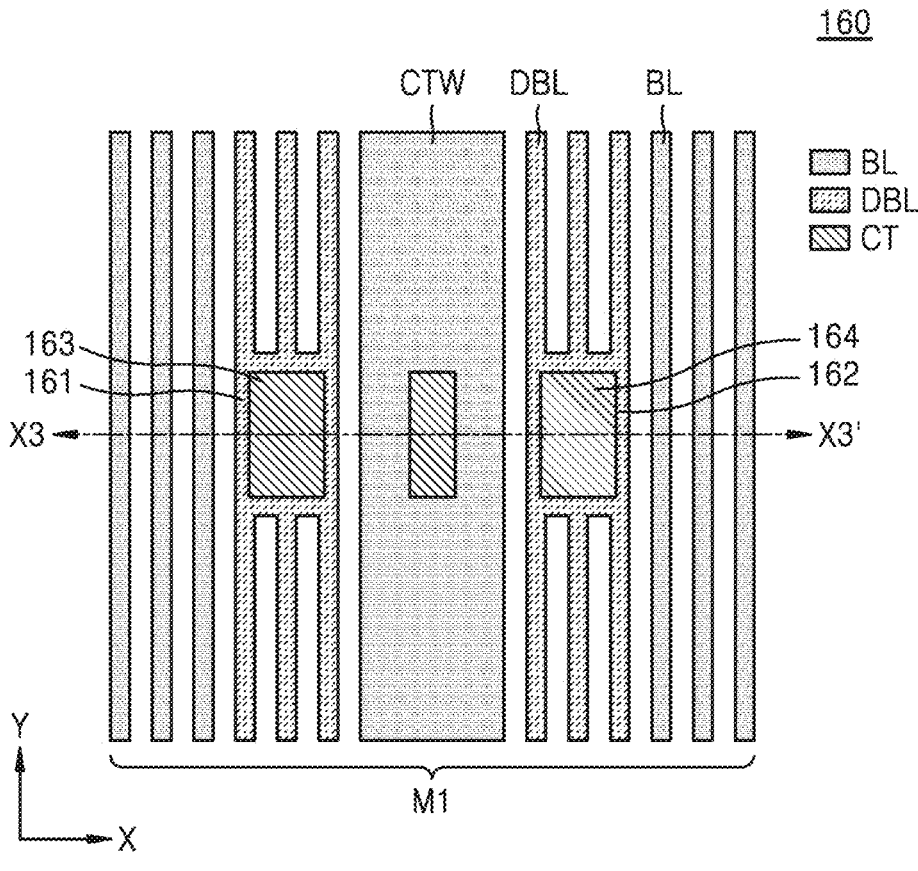
FIG. 16 is a plan view of a first metal layer of a memory device according to an embodiment.
Figure 17:
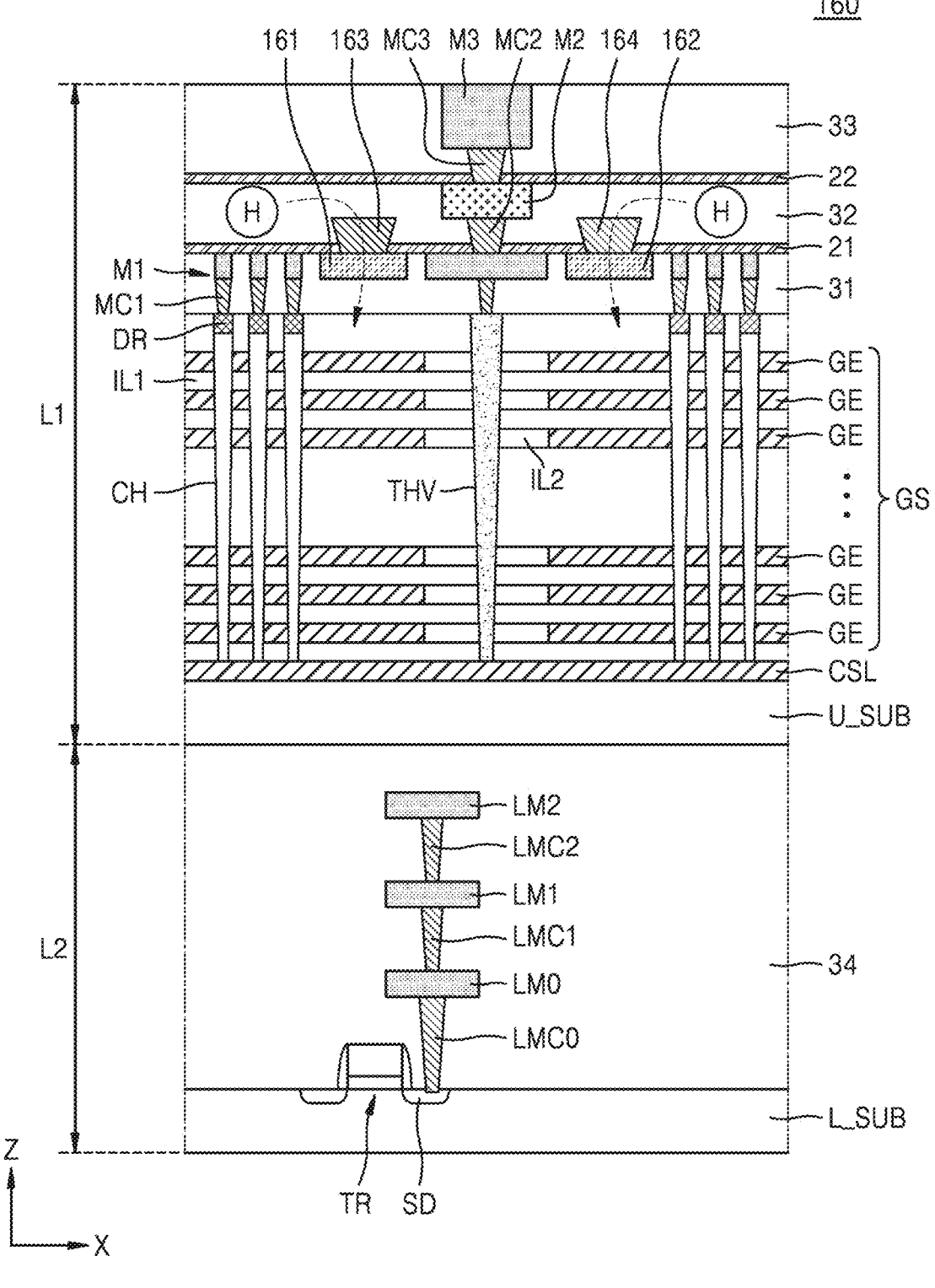
FIG. 17 is a cross-sectional view taken along a line X3-X3' of FIG. 16 according to an embodiment.

FIG. 16 is a plan view of the first metal layer M1 of a memory device 160 according to an embodiment. FIG. 17 is a cross-sectional view taken along a line X3-X3' of FIG. 16 according to an embodiment.

Referring to FIGS. 16 and 17 together, the memory device 160 corresponds to a modified example of the memory device 50 of FIGS. 5 and 6, and descriptions given above with reference to FIGS. 5 to 9B may also be applied to the present embodiment. According to the present embodiment, the first metal layer M1 of the memory device 160 may include dummy patterns 161 and 162 interconnecting the dummy bit lines DBL adjacent to each other. For example, the dummy patterns 161 and 162 may each have a shape crossing three dummy bit lines DBL adjacent to one another. Also, the memory device 160 may further include dummy contact plugs or dummy contacts 163 and 164 respectively arranged on the dummy patterns 161 and 162. In this case, the dummy contacts 163 and 164 may not be connected to the second metal layer M2, and thus, the dummy contacts 163 and 164 may be referred to as "floating contacts". For example, the dummy contacts 163 and 164 may overlap the dummy patterns 161 and 162, respectively, but inventive concepts are not limited thereto.

The dummy contacts 163 and 164 may penetrate through the first capping layer 21, thereby providing a hydrogen diffusion path or a hydrogen migration path through which hydrogen ions in the second upper insulation layer 32 transfer to the cell region. Through such a hydrogen migration path, hydrogen ions in the second upper insulation layer 32 may diffuse toward the gate structure GS and the channel structure CH, thereby improving cell characteristics by removing a dangling bond in a channel region or preventing charge loss of a charge storage layer. Therefore, the reliability of the memory device 160 may be improved.

Figure 18:
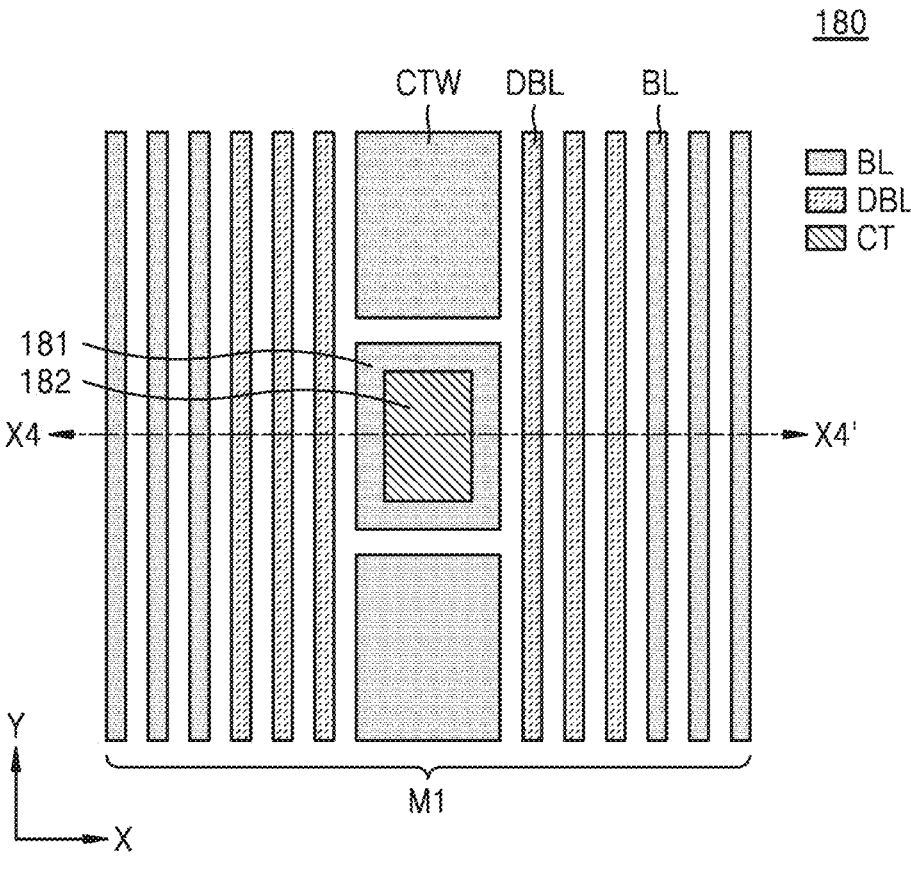
FIG. 18 is a plan view of a first metal layer of a memory device according to an embodiment.
Figure 19:
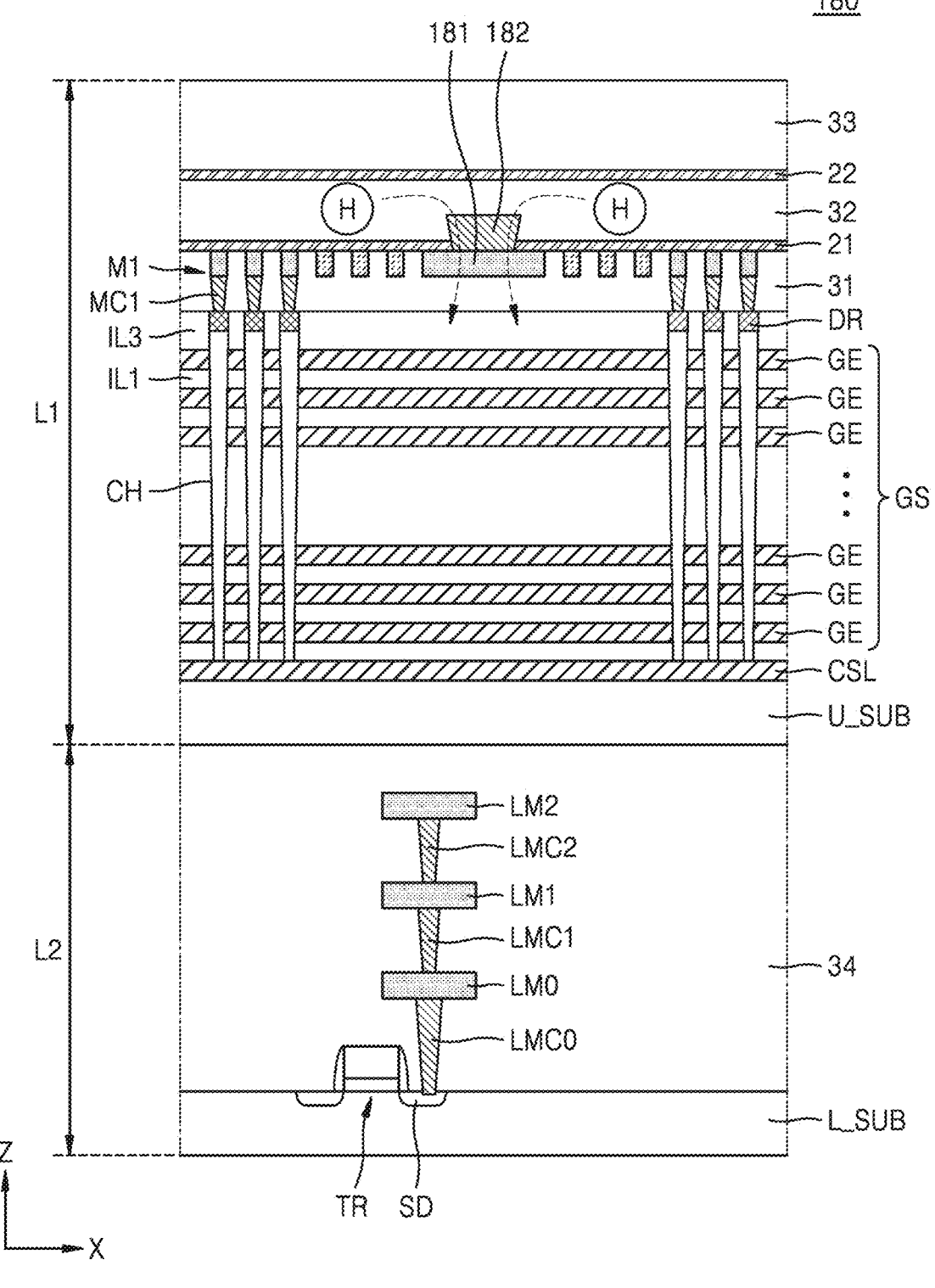
FIG. 19 is a cross-sectional view taken along a line X4-X4' of FIG. 18 according to an embodiment.

FIG. 18 is a plan view of the first metal layer M1 of a memory device 180 according to an embodiment. FIG. 19 is a cross-sectional view taken along a line X4-X4' of FIG. 18 according to an embodiment.

Referring to FIGS. 18 and 19 together, the memory device 180 corresponds to a modified example of the memory device 50 of FIGS. 5 and 6, and descriptions given above with reference to FIGS. 5 to 9B may also be applied to the present embodiment. According to the present embodiment, by applying a cutting layer to the common source line tapping wire CTW included in the first metal layer M1 of the memory device 180, a floating metal pattern 181 separated from the common source line tapping wire CTW may be formed. Also, the memory device 180 may further include a dummy contact plug or a dummy contact 182 disposed on the floating metal pattern 181. In this case, the dummy contact 182 may not be connected to the second metal layer M2, and thus, the dummy contact 182 may be referred to as a "floating contact".

The dummy contact 182 may penetrate through the first capping layer 21, thereby providing a hydrogen diffusion path or a hydrogen migration path through which hydrogen ions in the second upper insulation layer 32 transfer to the cell region. Through such a hydrogen migration path, hydrogen ions in the second upper insulation layer 32 may diffuse toward the gate structure GS and the channel structure CH, thereby improving cell characteristics by removing a dangling bond in a channel region or preventing charge loss of a charge storage layer. Therefore, the reliability of the memory device 180 may be improved.

Figure 20A:
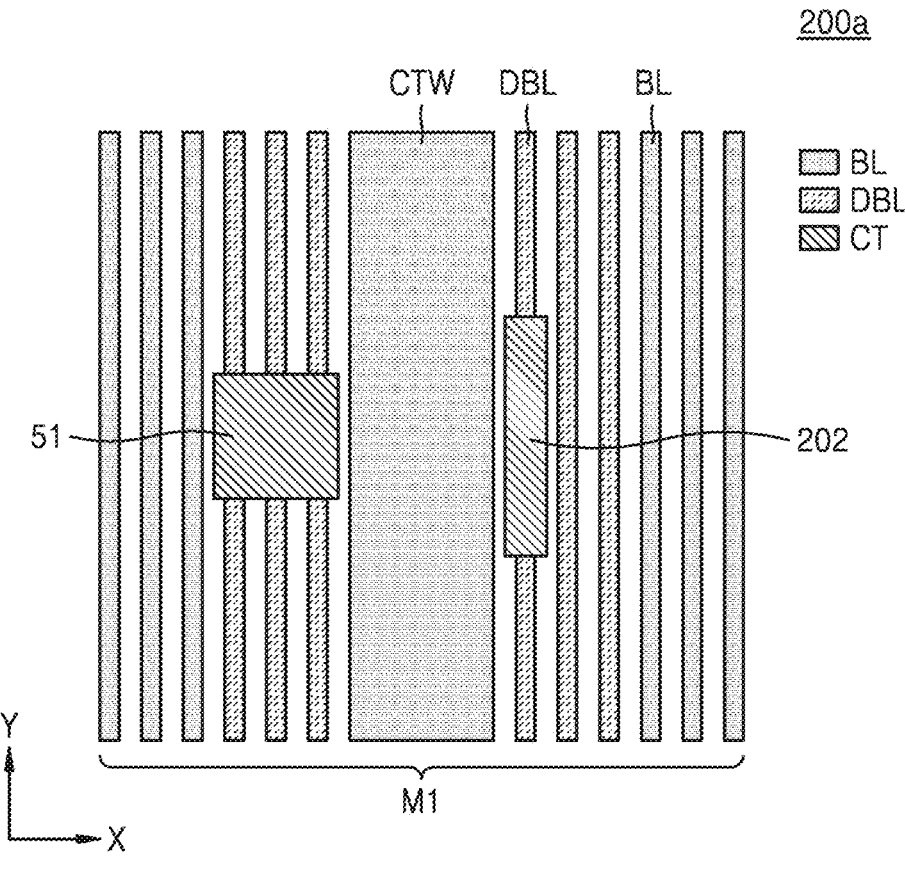
FIG. 20A is a plan view of a first metal layer of a memory device according to an embodiment.

FIG. 20A is a plan view of the first metal layer M1 of a memory device 200a according to an embodiment.

Referring to FIG. 20A, the memory device 200a corresponds to a modified example of memory devices shown in FIGS. 5 to 19, and thus, descriptions identical to those already given above will be omitted. The memory device 200a may include a dummy contact 51 disposed over the plurality of dummy bit lines DBL and a dummy contact 202 disposed over one dummy bit line DBL. For example, the dummy contact 202 may have a shape extending in the first direction Y, but inventive concepts are not limited thereto.

Figure 20B:
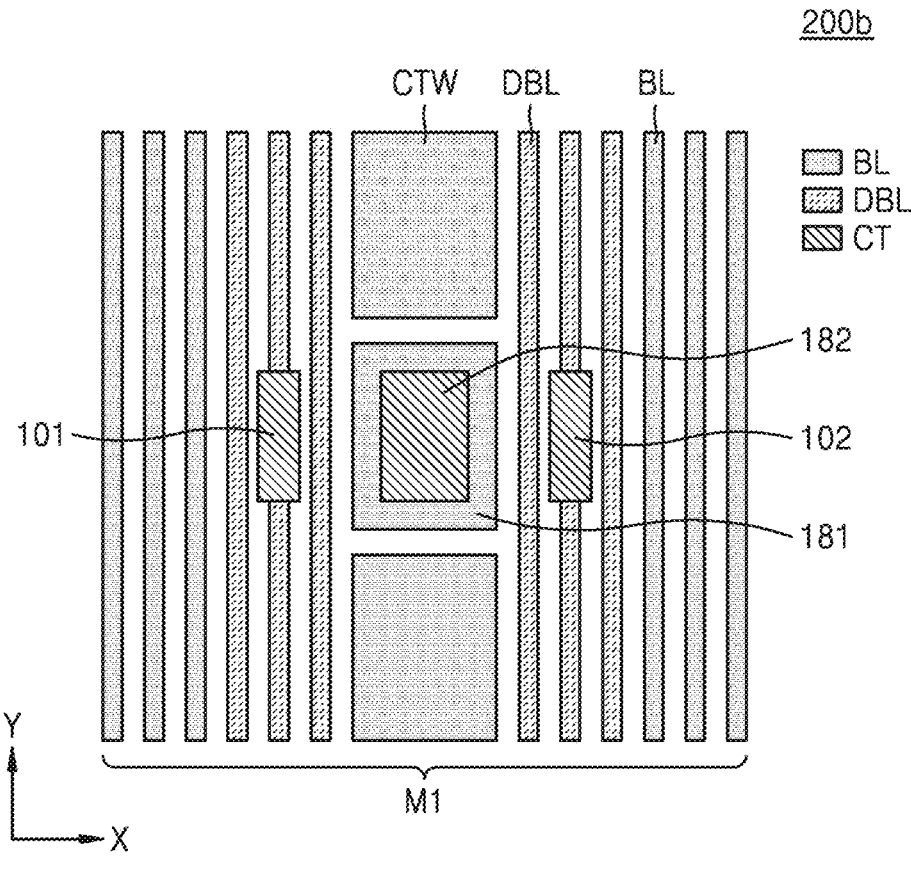
FIG. 20B is a plan view of a first metal layer of a memory device according to an embodiment.

FIG. 20B is a plan view of the first metal layer M1 of a memory device 200b according to an embodiment.

Referring to FIG. 20B, the memory device 200b corresponds to a modified example of memory devices shown in FIGS. 5 to 19, and thus, descriptions identical to those already given above will be omitted. The memory device 200b may include the dummy contacts 101 and 102 arranged over the dummy bit lines DBL and may include the dummy contact 182 disposed over the floating metal pattern 181 formed by applying a cutting layer to the common source line tapping wire CTW.

Figure 21:
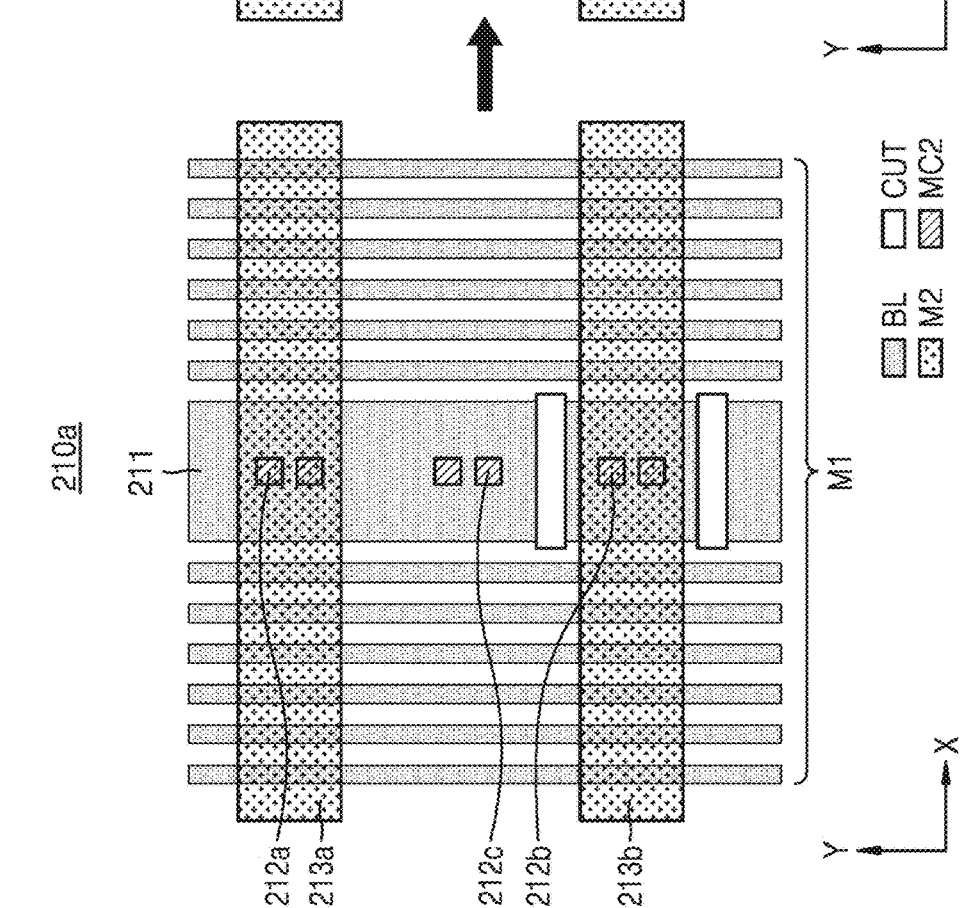
FIG. 21 is a plan view of a memory device according to an embodiment.
Figure 22:
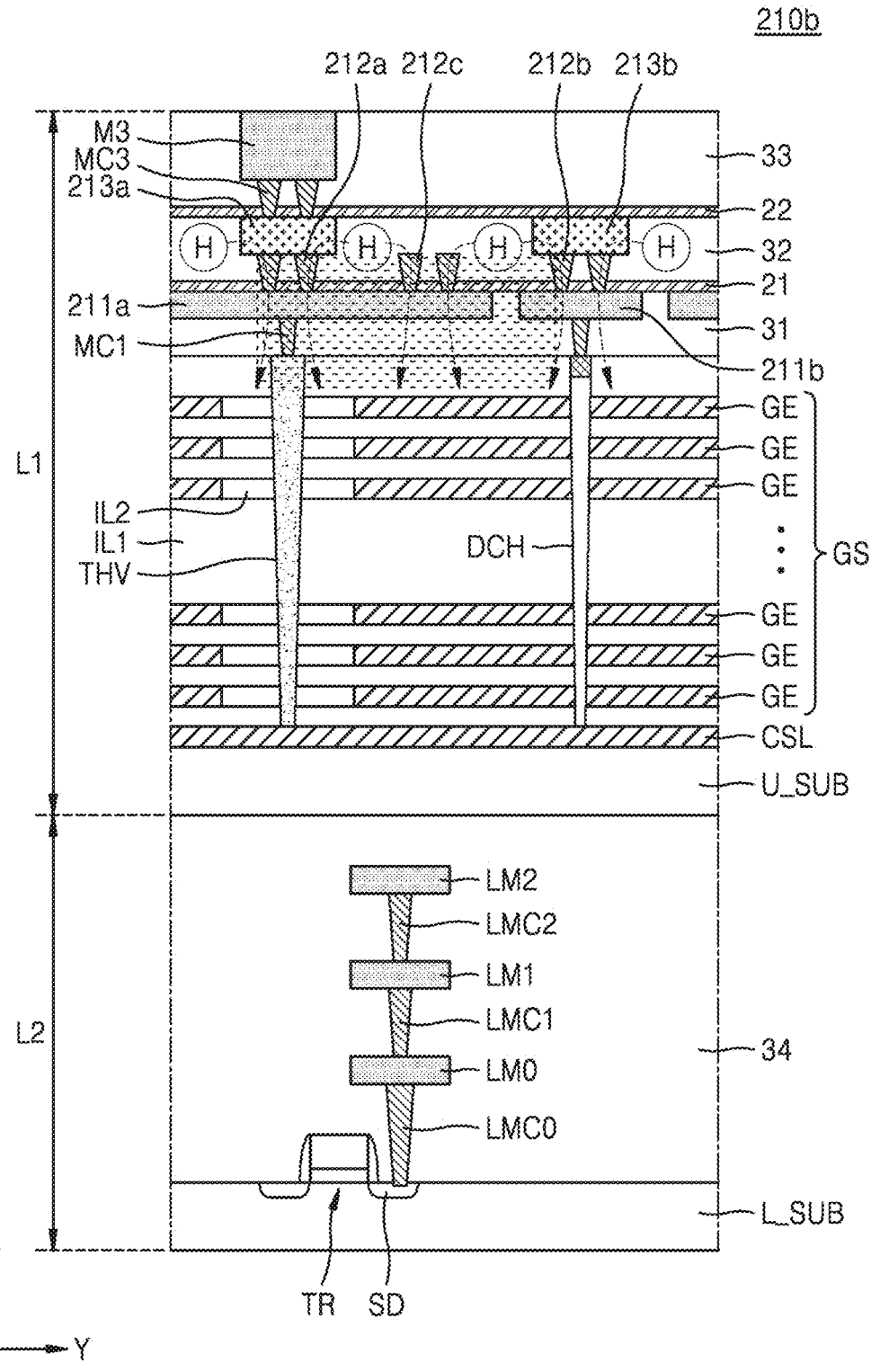
FIG. 22 is a cross-sectional view taken along a line Y1-Y1' of FIG. 21 according to an embodiment.
Figure 23:
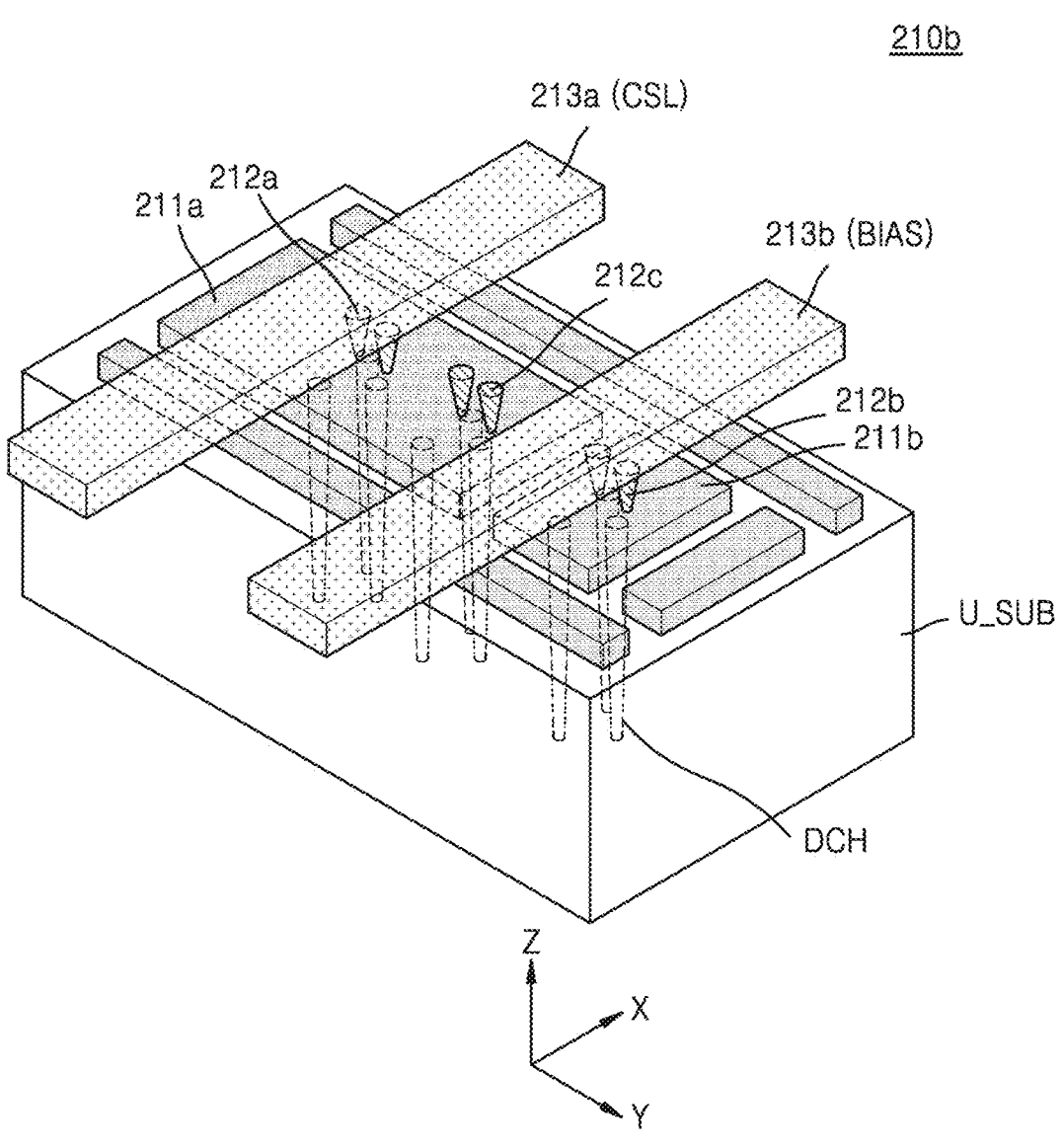
FIG. 23 is a perspective view of a portion of a memory device of FIG. 21 according to an embodiment.

FIG. 21 is a plan view of memory devices 210a and 210b according to an embodiment. FIG. 22 is a cross-sectional view taken along a line Y1-Y1' of FIG. 21 according to an embodiment. FIG. 23 is a perspective view of a portion of a memory device 210b of FIG. 21 according to an embodiment.

Referring to FIGS. 21 to 23 together, a memory device 210a may include the first metal layer M1, the second metal layer M2, and contacts MC2 interconnecting the first metal layer M1 and the second metal layer M2. The first metal layer M1 may include the bit lines BL and metal lines 211 each extending in the first direction Y. A metal line 211 may have a big pattern having a greater size in the second direction X, e.g., the width, as compared to the bit lines BL. The contacts MC2 arranged on the metal line 211 may include first contacts 212a, second contacts 212b, and third contacts 212c, and the second metal layer M2 may include second metal lines 213a and 213b. The metal line 211 may be connected to a second metal line 213a through the first contacts 212a and may be connected to a second metal line 213b through the second contacts 212b. In this case, no second metal line may be disposed over the third contacts 212c.

In this case, the memory device 210b may be formed by applying a cutting layer CUT onto the metal line 211 of the memory device 210a. A common source line tapping wire 211a and a node wire 211b may be formed from the metal line 211 by the cutting layer CUT. The common source line tapping wire 211a, the first contacts 212a, and the second metal line 213a may be electrically connected to one another to constitute a first node ND1, and a common source line voltage may be applied to the first node ND1. Meanwhile, the node wire 211b, the second contacts 212b, and the second metal line 213b may be electrically connected to one another to form a second node ND2, and a certain bias voltage BIAS, e.g., a ground voltage, may be applied to the second node ND2. For example, the second node ND2 may be connected to a dummy channel structure DCH, but inventive concepts are not limited thereto.

The second upper insulation layer 32 may be a hydrogen-providing insulation layer, and, as first to third contacts 212a, 212b, and 212c penetrate through the first capping layer 21, hydrogen ions in the second upper insulation layer 32 may move to the cell region. According to the present embodiment, the first contacts 212a may be metal contact plugs that transmit a common source line voltage, the second contacts 212b may be metal contact plugs that transmit a bias voltage, and the third contacts 212c may be dummy contact plugs. In this regard, by applying the cutting layer CUT to the metal line 211 included in the first metal layer M1, a plurality of metal patterns or wires may be formed, and the plurality of metal patterns may be used as different nodes. In this regard, by forming a plurality of contacts on the gate structure GS and the channel structures CH, a plurality of hydrogen migration paths from the second upper insulation layer 32 to the gate structure GS and the channel structures CH may be obtained.

Figure 24A:
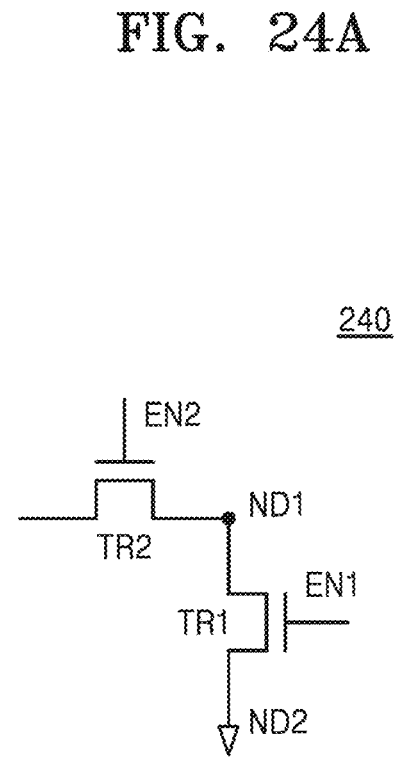
Figure 24B:
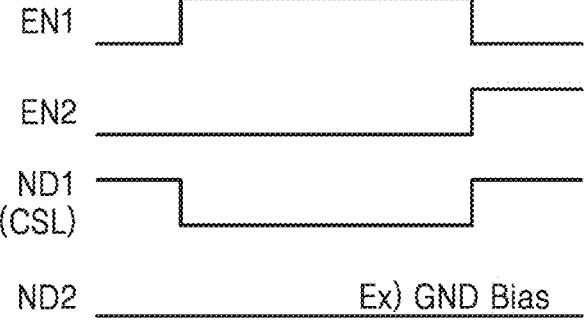
FIG. 24B is a timing diagram showing signals applied to the common source line driving circuit according to an embodiment.

FIG. 24A is a circuit diagram showing a common source line driving circuit 240 according to an embodiment, and FIG. 24B is a timing diagram showing signals applied to the common source line driving circuit 240 according to an embodiment.

Referring to FIGS. 21, 24A and 24B together, the common source line driving circuit 240 may include a first transistor TR1 and a second transistor TR2. The first transistor TR1 may be driven by a first enable signal EN1, and the second transistor TR2 may be driven by a second enable signal EN2. The first node ND1 between the first transistor TR1 and the second transistor TR2 may correspond to a common source line. For example, the second node ND2 may correspond to a ground (GND) node. As described above, according to the present embodiment, the common source line tapping wire 211a and the node wire 211b may be formed by applying the cutting layer CUT to the big pattern included in the first metal layer M1, e.g., the metal line 211. In this case, the second contacts 212b over the node wire 211b are arranged adjacent to a cell region, thereby forming a plurality of hydrogen migration paths close to the cell region.

Figure 25:
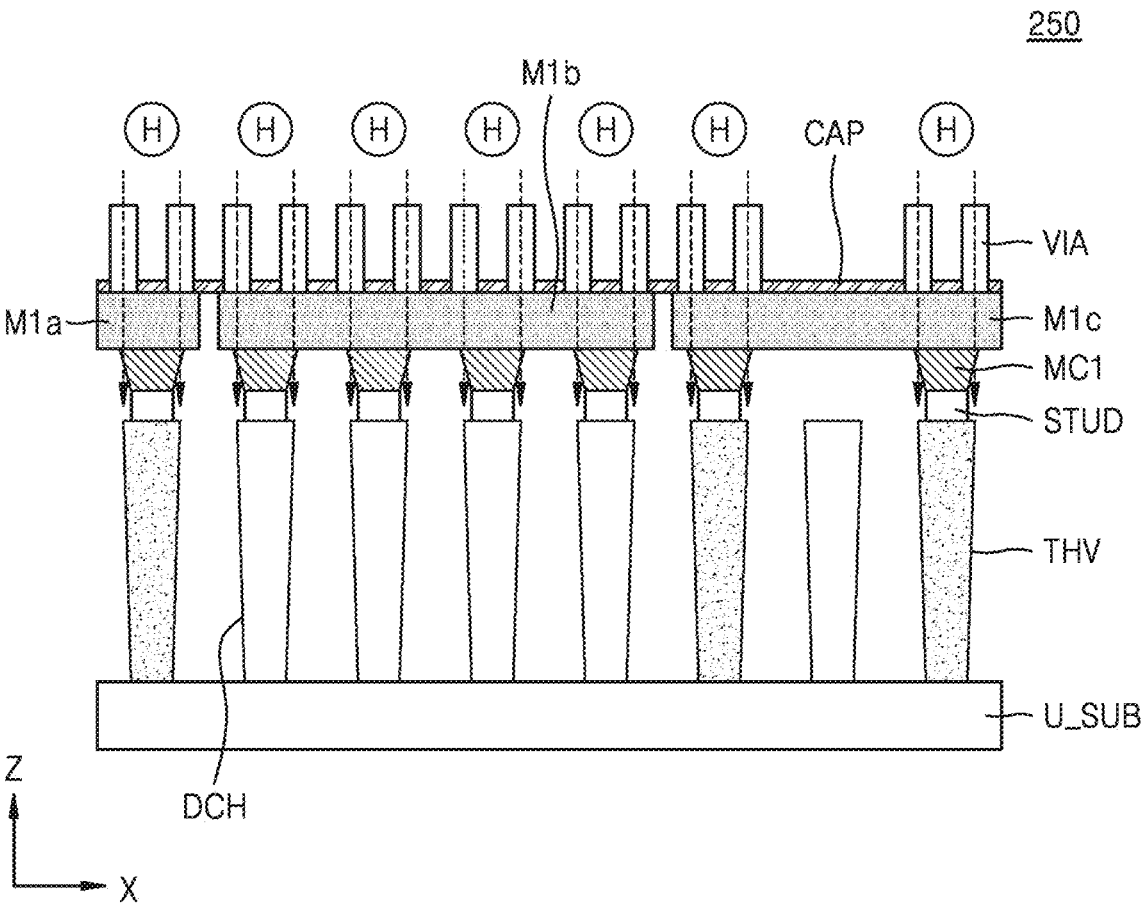
FIG. 25 is a cross-sectional view of a memory device according to an embodiment.

FIG. 25 is a cross-sectional view of a memory device 250 according to an embodiment.

Referring to FIG. 25, the memory device 250 may include through electrodes THV and dummy channel structures DCH extending in the vertical direction Z over the upper substrate U_SUB. The memory device 250 may further include contacts MC1, studs STUD, first metal patterns M1a, M1b, and M1c, a capping layer CAP, and vias VIA. For example, the first metal patterns M1a, M1b, and M1c may be implemented as a first metal layer (e.g., M1 of FIG. 21), but inventive concepts are not limited thereto.

The first metal patterns M1a, M1b, and M1c may be formed by applying a cutting layer to a first metal line extending in the second direction X. First metal patterns M1a and M1c may be connected to the through electrodes THV through the contacts MC1 and the studs STUD. For example, the first metal patterns M1a and M1c may correspond to common source line tapping wires to which a common source line voltage is applied. A first metal pattern M1b may be connected to the dummy channel structures DCH through the contacts MC1 and the studs STUD. However, inventive concepts are not limited thereto, and the first metal pattern M1b may not be connected to the dummy channel structures DCH, or the first metal pattern M1b may be connected to channel structures. For example, the first metal pattern M1b may correspond to a node wire to which a certain bias voltage (e.g., ground voltage) is applied. According to the present embodiment, the vias VIA may penetrate through the capping layer CAP and be connected to the first metal patterns M1a, M1b, and M1c and provide a hydrogen migration path through which hydrogen in the upper portion of the capping layer CAP move toward the through electrodes THV and the dummy channel structures DCH therebelow.

Figure 26:
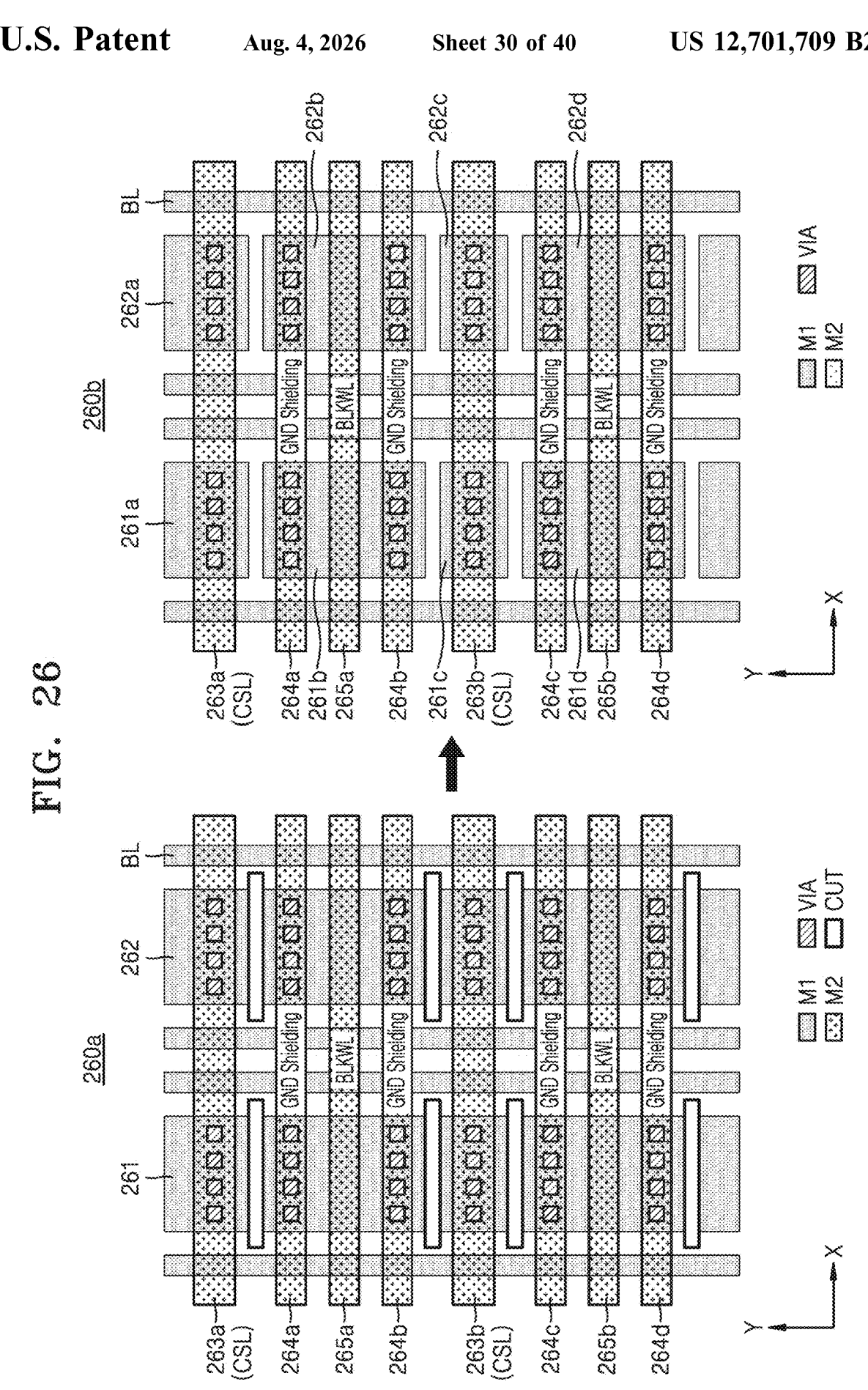
FIG. 26 is a plan view of a memory device according to an embodiment.

FIG. 26 is a plan view of memory devices 260a and 260b according to an embodiment.

Referring to FIG. 26, a memory device 260a may include the first metal layer M1, the second metal layer M2, and the vias VIA. The first metal layer M1 may include the bit lines BL and first metal lines 261 and 262 each extending in the first direction Y, and the second metal layer M2 may include second metal lines 263a, 263b, 264a to 264d, 265a, and 265b each extending in the second direction X. In this case, as the cutting layer CUT is applied to the first metal lines 261 and 262, a memory device 260b in which each of the first metal lines 261 and 262 is separated into a plurality of metal patterns may be formed.

The memory device 260b may include first metal patterns 261a to 261d separated from a first metal line 261 and first metal patterns 262a to 262d separated from a first metal line 262. Second metal lines 263a and 263b may be used as common source line tapping wires to which a common source line voltage is applied, second metal lines 264a to 264d may be used as ground shielding wires to which a certain bias voltage, e.g., a ground voltage, is applied, and second metal lines 265a and 265b may be used as block word line wires to which a block word line voltage BLKWL is applied.

First metal patterns 261a, 261c, 262a, and 262c may be electrically connected to the second metal lines 263a and 263b through the plurality of vias VIA, and thus the first metal patterns 261a, 261c, 262a, and 262c may receive a common source line voltage. Also, first metal patterns 261b, 261d, 262b, and 262d may be electrically connected to the second metal lines 264a to 264d through the plurality of vias VIA, and thus the first metal patterns 261b, 261d, 262b, and 262d may receive a certain bias voltage, e.g., a ground voltage.

As described above, according to the present embodiment, a plurality of first metal patterns 261a to 261d and 262a to 262d may be formed by applying the cutting layer CUT to the first metal lines 261 and 262, and a plurality of vias VIA may be arranged over the plurality of first metal patterns 261a to 261d and 262a to 262d. Therefore, the number of vias VIA penetrating through a capping layer over the first metal lines 261 and 262 may be increased, and thus a plurality of hydrogen migration paths through which hydrogen included in an upper insulation layer move to a cell region may be obtained. Also, according to some embodiments, a plurality of vias that do not overlap with the second metal layer M2 may be further arranged over the plurality of first metal patterns 261a to 261d and 262a to 262d, thereby providing more hydrogen migration paths.

Figure 27:
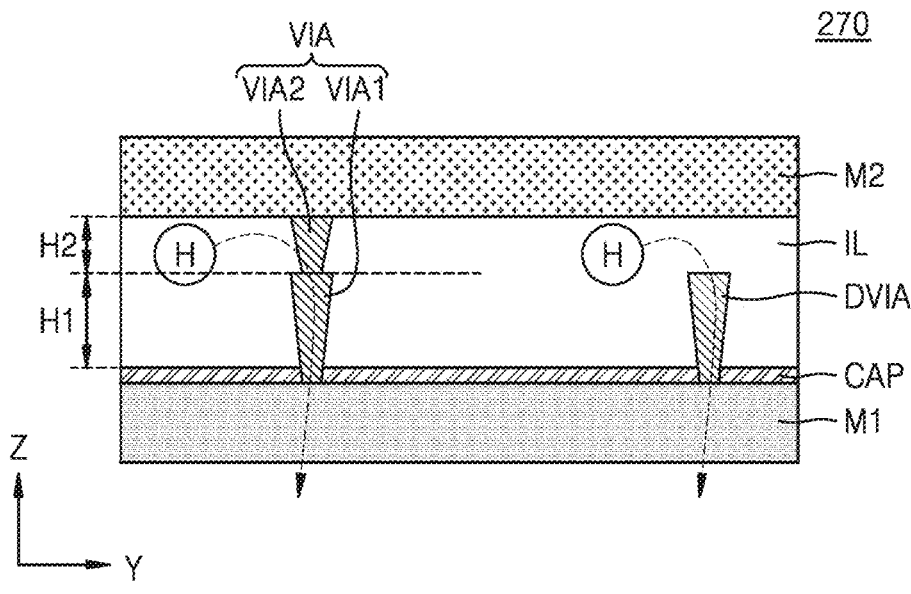
FIG. 27 is a cross-sectional view of a via and a dummy via according to an embodiment.

FIG. 27 is a cross-sectional view of a via VIA and a dummy via DVIA according to an embodiment.

Referring to FIG. 27, a memory device 270 may include the first metal layer M1, the capping layer CAP, an upper insulation layer IL, and the second metal layer M2. Also, the memory device 270 may further include the via VIA and the dummy via DVIA arranged on the first metal layer M1. The via VIA may be used as a metal contact or a metal contact plug interconnecting the first metal layer M1 and the second metal layer M2, and the dummy via DVIA may be used as a dummy contact or a dummy contact plug that is not connected to the second metal layer M2.

The via VIA may be implemented as a 2-stack via including a first via VIA1 and a second via VIA2. In this case, the first via VIA1 has a first height H1 in the vertical direction Z, and the second via VIA2 has a second height H2 in the vertical direction Z. The dummy via DVIA has the first height H1 in the vertical direction Z. Therefore, the first via VIA1 and the dummy via DVIA may be formed through the same process, and then the second via VIA2 may be formed.

According to an embodiment, the dummy via DVIA and the first via VIA1 may have different sizes in the first direction Y or the second direction X. According to an embodiment, the dummy via DVIA and the first via VIA1 may have different heights in the vertical direction Z. According to an embodiment, the dummy via DVIA may include a first dummy via and a second dummy via, and the first dummy via and the second dummy via may have different sizes in the first direction Y or the second direction X.

According to the present embodiment, the via VIA and the dummy via DVIA may penetrate through the capping layer CAP, thereby providing a hydrogen migration path through which hydrogen included in the upper insulation layer IL moves. In this regard, the memory device 270 may include a plurality of dummy vias DVIA not connected to the second metal layer M2, thereby forming a plurality of hydrogen migration paths.

Figure 28:
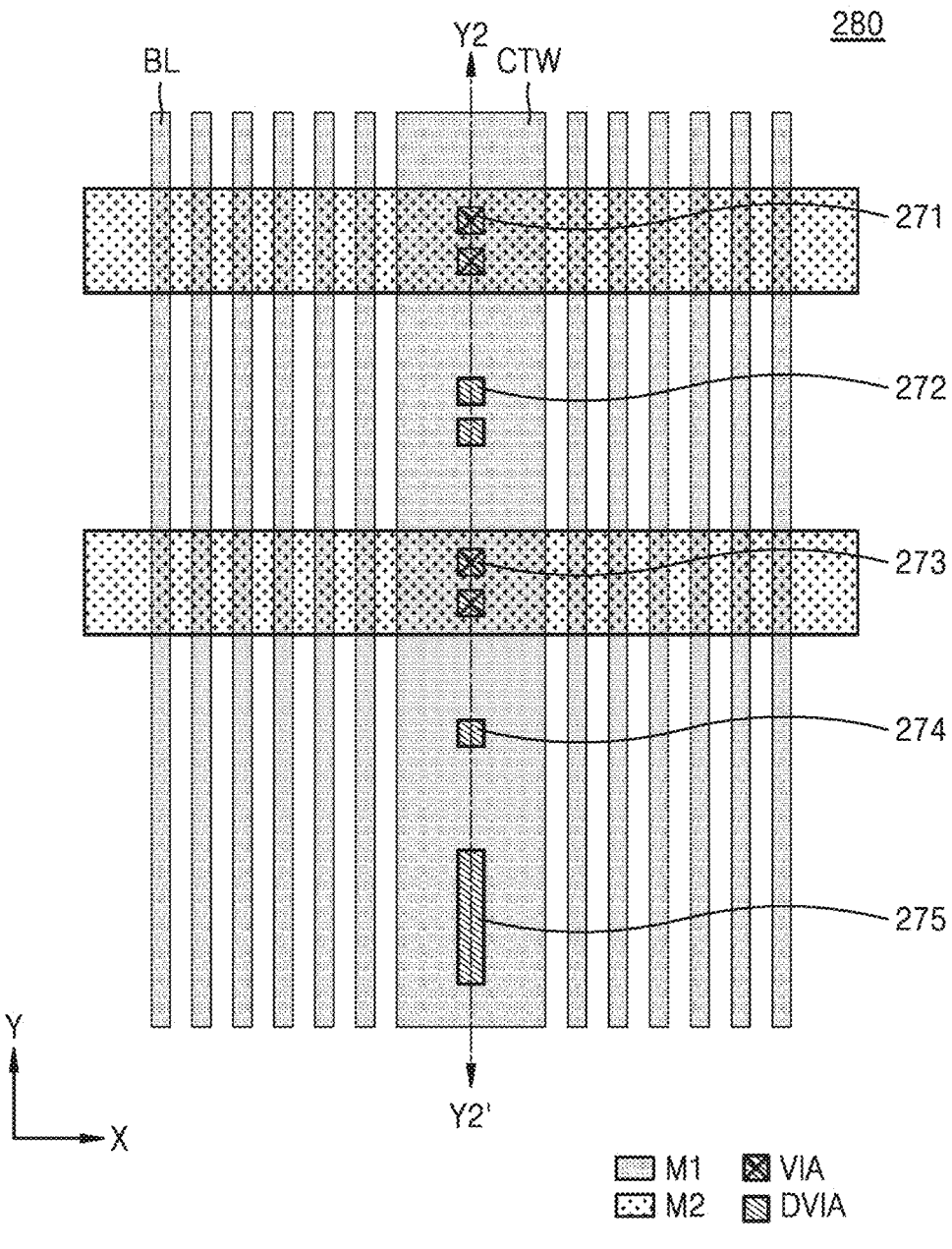
FIG. 28 is a plan view of a memory device according to an embodiment.
Figure 29:
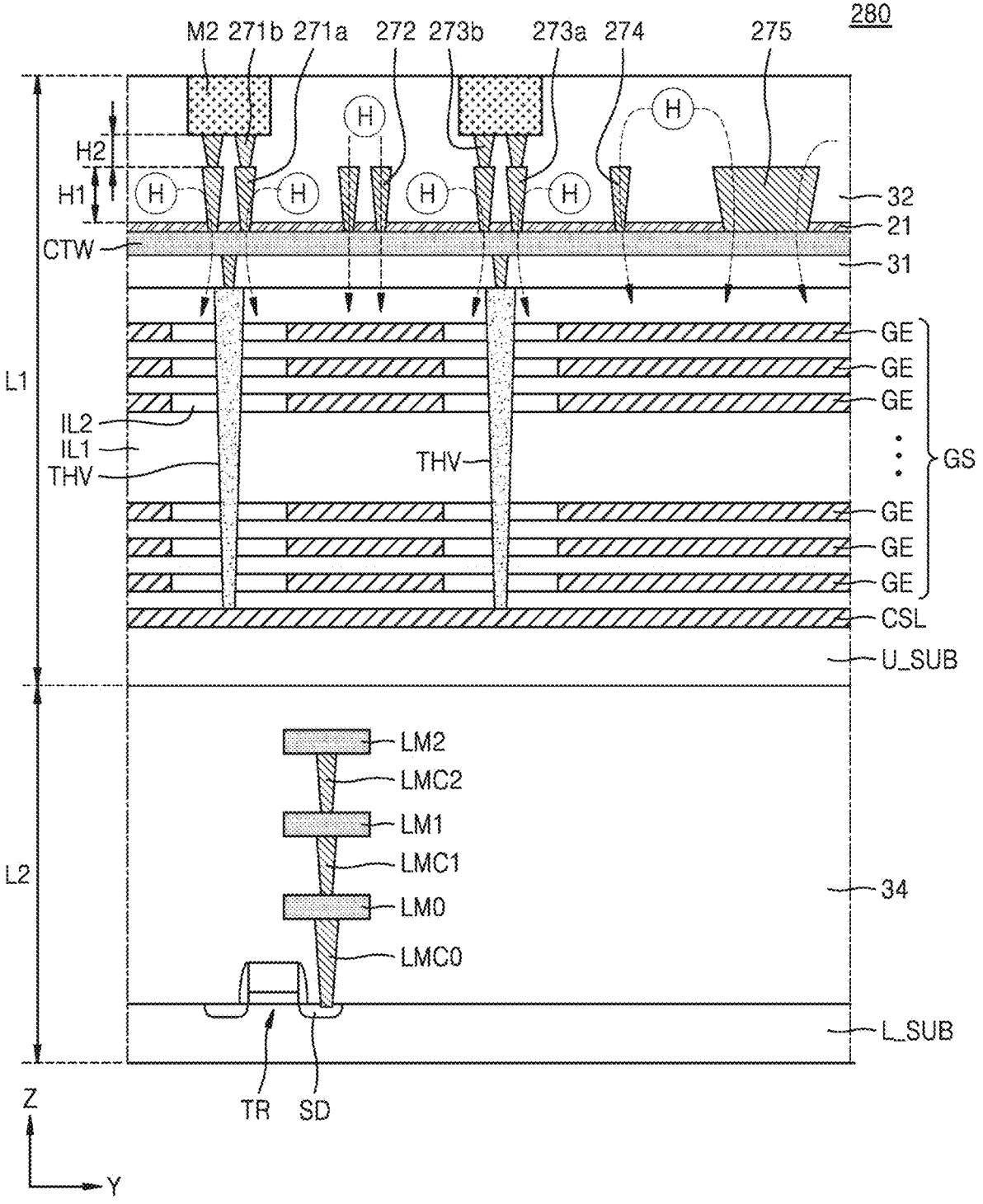
FIG. 29 is a cross-sectional view taken along a line Y2-Y2' of FIG. 28 according to an embodiment.

FIG. 28 is a plan view of a memory device 280 according to an embodiment. FIG. 29 is a cross-sectional view taken along a line Y2-Y2' of FIG. 28 according to an embodiment.

Referring to FIGS. 28 and 29 together, the memory device 280 may include the first metal layer M1, the second metal layer M2, the vias VIA, and the dummy vias DVIA. The first metal layer M1 may include the bit lines BL and the common source line tapping wire CTW each extending in the first direction Y and may be connected to the second metal layer M2 through the vias VIA. The vias VIA may include vias 271 and 273 overlapping the second metal layer M2, and the vias 271 and 273 may each be, for example, implemented as a 2-stack via like the via VIA of FIG. 27. A via 271 may include a first via 271a and a second via 271b, and a via 273 may include a first via 273a and a second via 273b. The dummy vias DVIA may include dummy vias 272, 274, and 275 that do not overlap the second metal layer M2, and the dummy vias 272, 274, and 275 may each be, for example, implemented as an 1-stack via like the dummy via DVIA of FIG. 27.

According to some embodiments, the first metal layer M1 may further include at least one dummy bit line extending in the first direction Y, and the memory device 280 may further include at least one dummy via disposed on the at least one dummy bit line and having a first height. According to some embodiments, the memory device 280 may further include at least one dummy via disposed over at least one of the plurality of bit lines BL and having a first height. According to an embodiment, the dummy via DVIA may include a first dummy via and a second dummy via, and the first dummy via and the second dummy via may have different sizes in the first direction Y or the second direction X.

Figure 30:
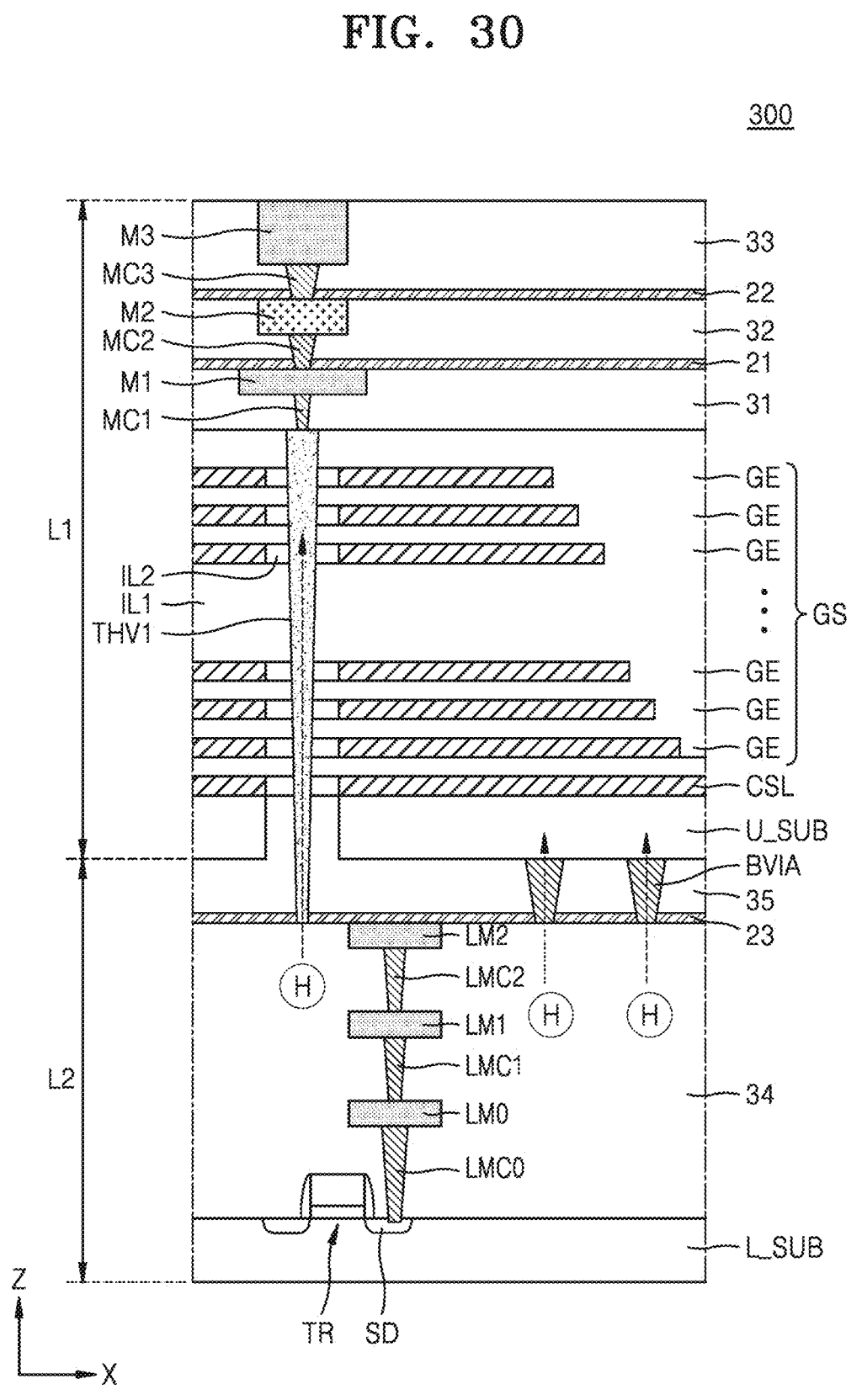

FIG. 30 is a cross-sectional view of a memory device 300 according to an embodiment.

Referring to FIG. 30, the memory device 300 corresponds to a modified example of the memory device 50 of FIG. 6, and thus, descriptions identical to those already given above will be omitted. The memory device 300 may include a through electrode THV1 extending in the vertical direction Z and penetrating through the gate structure GS, the common source line CSL, and the upper substrate U_SUB. The second semiconductor layer L2 may include the lower substrate L_SUB, lower metal layers LM0, LM1, and LM2, lower metal contacts LMC0, LMC1, and LMC2, a capping layer 23, and lower insulation layers 34 and 35. The lower insulation layer 34 may be a hydrogen-providing insulation layer, and the capping layer 23 may be disposed on the lower insulation layer 34 to prevent diffusion of hydrogen contained in the lower insulation layer 34.

According to the present embodiment, the through electrode THV1 may extend in the vertical direction Z and penetrate through a lower insulation layer 35 and the capping layer 23 of the second semiconductor layer L2. Therefore, the through electrode THV1 may provide a migration path for hydrogen included in the lower insulation layer 34, and the hydrogen included in the lower insulation layer 34 may be diffused into the cell region of the first semiconductor layer L1, e.g., the gate structure GS, by a heat treatment process.

Also, the second semiconductor layer L2 may further include a plurality of vias BVIA. Top surfaces of the plurality of vias BVIA may contact the bottom surface of the upper substrate U_SUB. In other words, the plurality of vias BVIA may be arranged between the upper substrate U_SUB and a lower metal layer LM2 or the lower insulation layer 34. The plurality of vias BVIA may include a conductive material, and thus the plurality of vias BVIA may be referred to as "conductive landing vias" or "bypass vias". For example, the plurality of vias BVIA may include a doped semiconductor material or an undoped semiconductor material. For example, the plurality of vias BVIA may include doped polysilicon or undoped polysilicon, but is not limited thereto.

The plurality of vias BVIA may penetrate through the capping layer 23, thereby providing a migration path for hydrogen included in the lower insulation layer 34. Therefore, hydrogen included in the lower insulation layer 34 may be diffused into the cell region of the first semiconductor layer L1, e.g., the gate structure GS, by a heat treatment process. In this regard, according to the present embodiment, in the memory device 300 having a COP structure, by implementing the lower insulation layer 34 included in a peripheral circuit overlapping the cell region in the vertical direction Z as a hydrogen-providing insulation layer and forming a plurality of hydrogen migration paths from the lower insulation layer 34 to the cell region by forming the plurality of vias BVIA, the efficiency of an alloying process may be improved.

Figure 31:
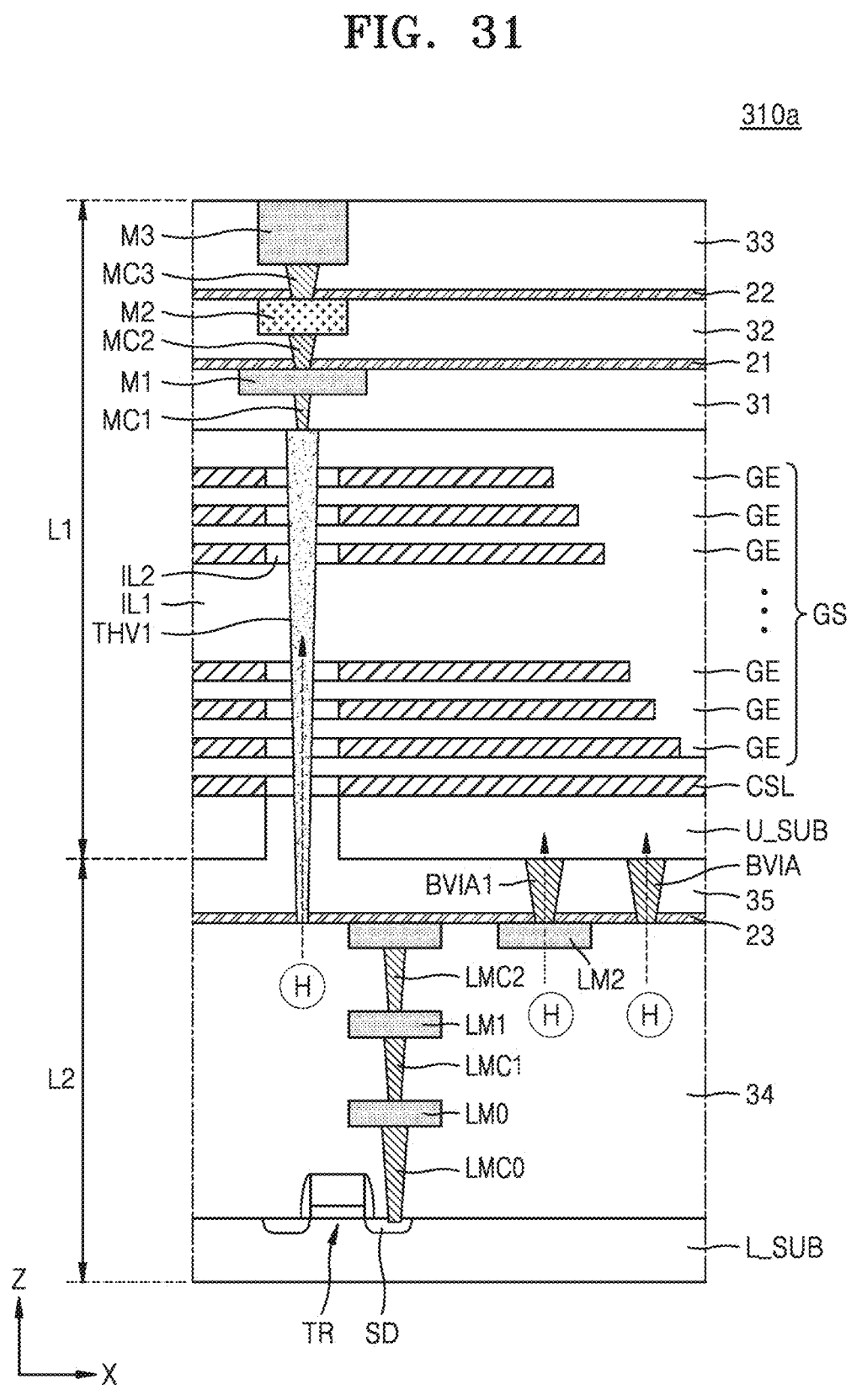
Figure 32:
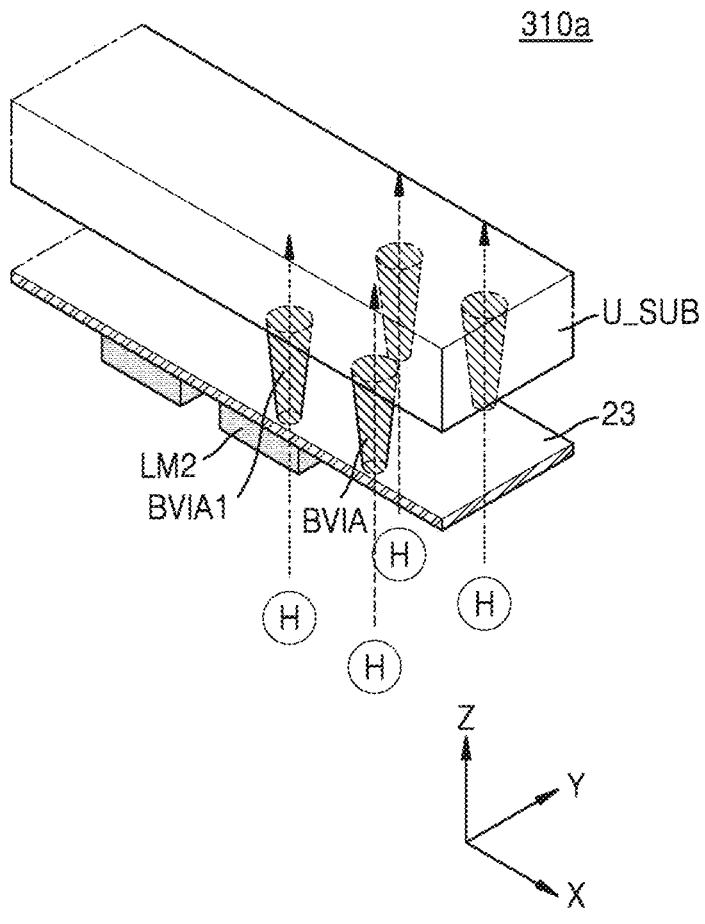
FIG. 32 is a perspective view of a portion of a memory device according to an embodiment.

FIG. 31 is a cross-sectional view of a memory device 310a according to an embodiment. FIG. 32 is a perspective view of a portion of the memory device 310a of FIG. 31, according to an embodiment.

Referring to FIGS. 31 and 32 together, the memory device 310a may be a modified example of the memory device 300 shown in FIG. 30, and thus, descriptions identical to those already given above will be omitted. The second semiconductor layer L2 of the memory device 310a may include a plurality of vias BVIA and BVIA1. A via BVIA may be disposed on the lower insulation layer 34, and a via BVIA1 may be disposed on the lower metal layer LM2. For example, the vias BVIA may be arranged on the lower insulation layer 34 along a line in the first direction Y, but inventive concepts are not limited thereto. For example, vias BVIA1 may be arranged on the lower metal layer LM2 along a line, but inventive concepts are not limited thereto.

The vias BVIA and BVIA1 may penetrate through the capping layer 23, thereby providing a migration path for hydrogen included in the lower insulation layer 34. Therefore, hydrogen included in the lower insulation layer 34 may be diffused into the cell region of the first semiconductor layer L1, e.g., the gate structure GS, by a heat treatment process.

Figure 33:
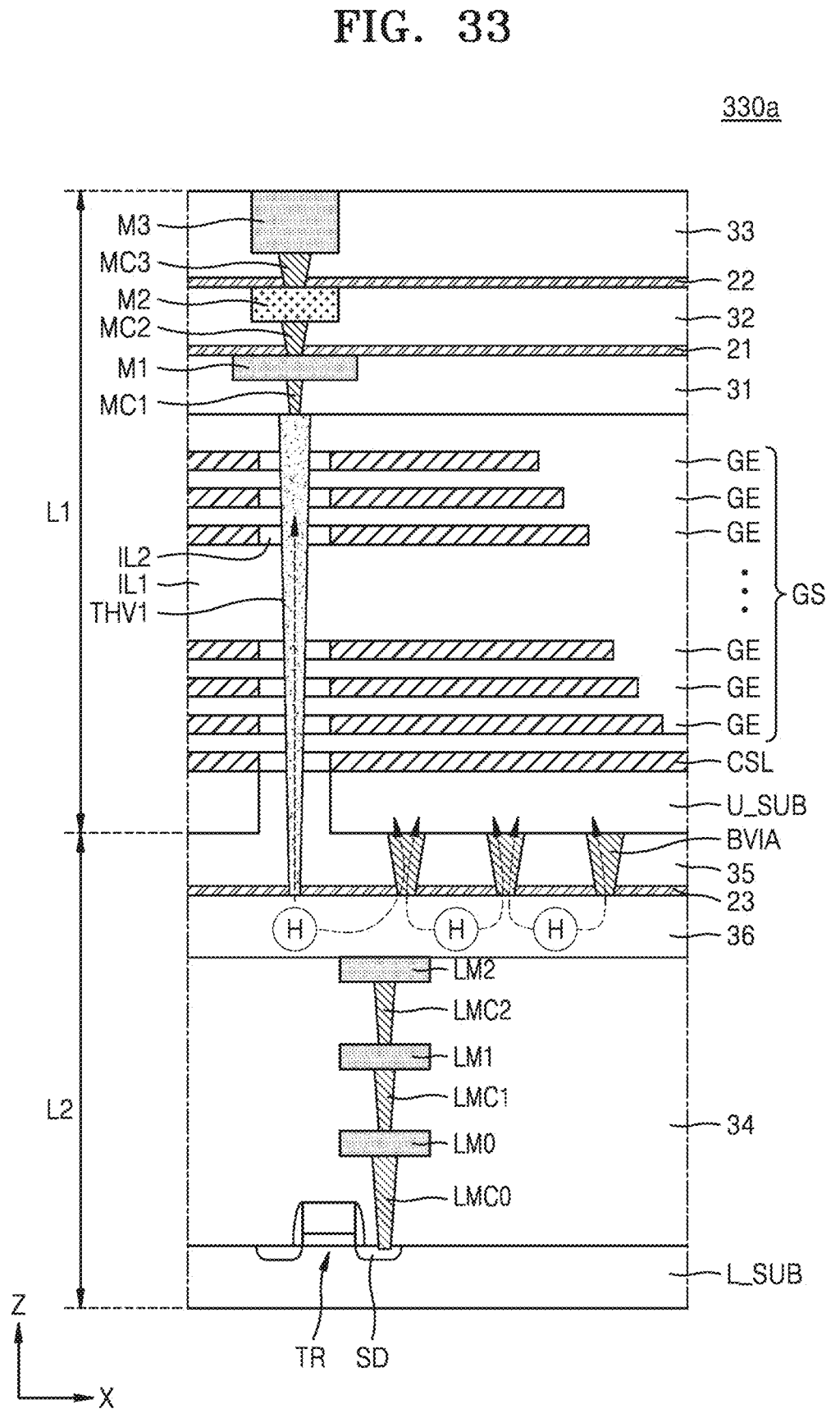
Figure 34:
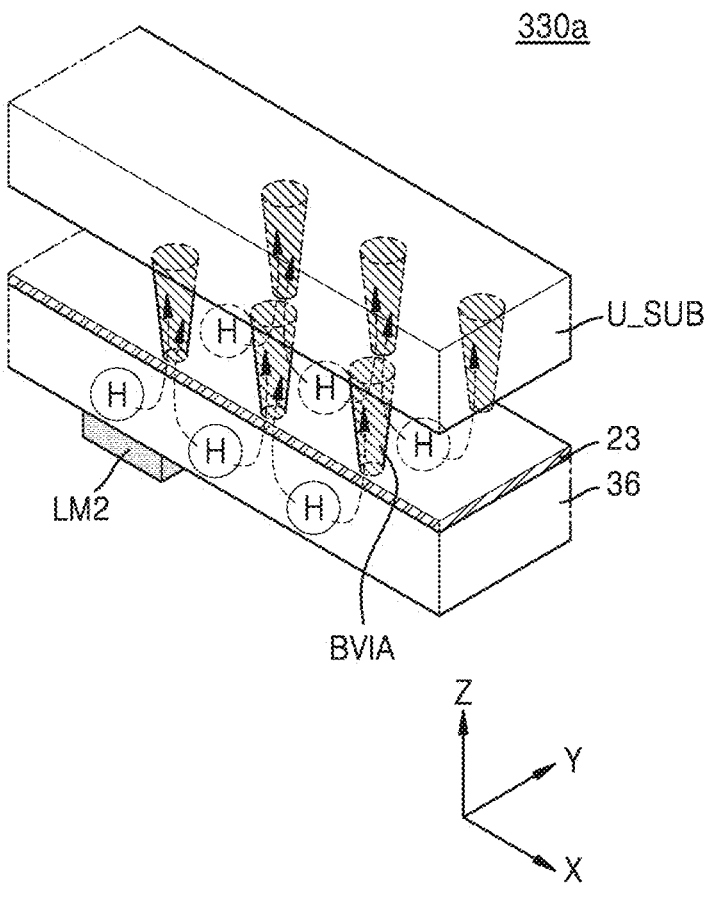
FIG. 34 is a perspective view of a portion of a memory device according to an embodiment.

FIG. 33 is a cross-sectional view of a memory device 330a according to an embodiment. FIG. 34 is a perspective view of a portion of the memory device 330a of FIG. 33, according to an embodiment.

Referring to FIGS. 33 and 34 together, the memory device 330a may be a modified example of the memory device 300 shown in FIG. 30, and thus, descriptions identical to those already given above will be omitted. The second semiconductor layer L2 of the memory device 330a may further include a lower insulation layer 36, and the lower insulation layer 36 may be a hydrogen-providing insulation layer. The capping layer 23 is disposed on the lower insulation layer 36 and may serve as a barrier capping layer to limit and/or prevent diffusion of hydrogen included in the lower insulation layer 36.

The vias BVIA are arranged on the lower insulation layer 36 and penetrate through the capping layer 23, thereby providing a migration path for hydrogen included in the lower insulation layer 36. Therefore, hydrogen included in the lower insulation layer 36 may be diffused into the cell region of the first semiconductor layer L1, e.g., the gate structure GS, by a heat treatment process. According to an embodiment, the second semiconductor layer L2 may include the lower metal layer LM2 extending in the first direction Y and a dummy lower metal layer extending in the second direction X. The lower metal layer LM2 and the dummy lower metal layer may be arranged at the same level. The lower insulation layer 36 may be disposed over the lower metal layer LM2 and the dummy lower metal layer, and the vias BVIA may be arranged along a line on the lower insulation layer 36. According to some embodiments, the via BVIA may include at least one from among a first via connected to the lower insulation layer 34, a second via connected to the lower metal layer LM2, and a third via connected to the lower insulation layer 36.

Figure 35:
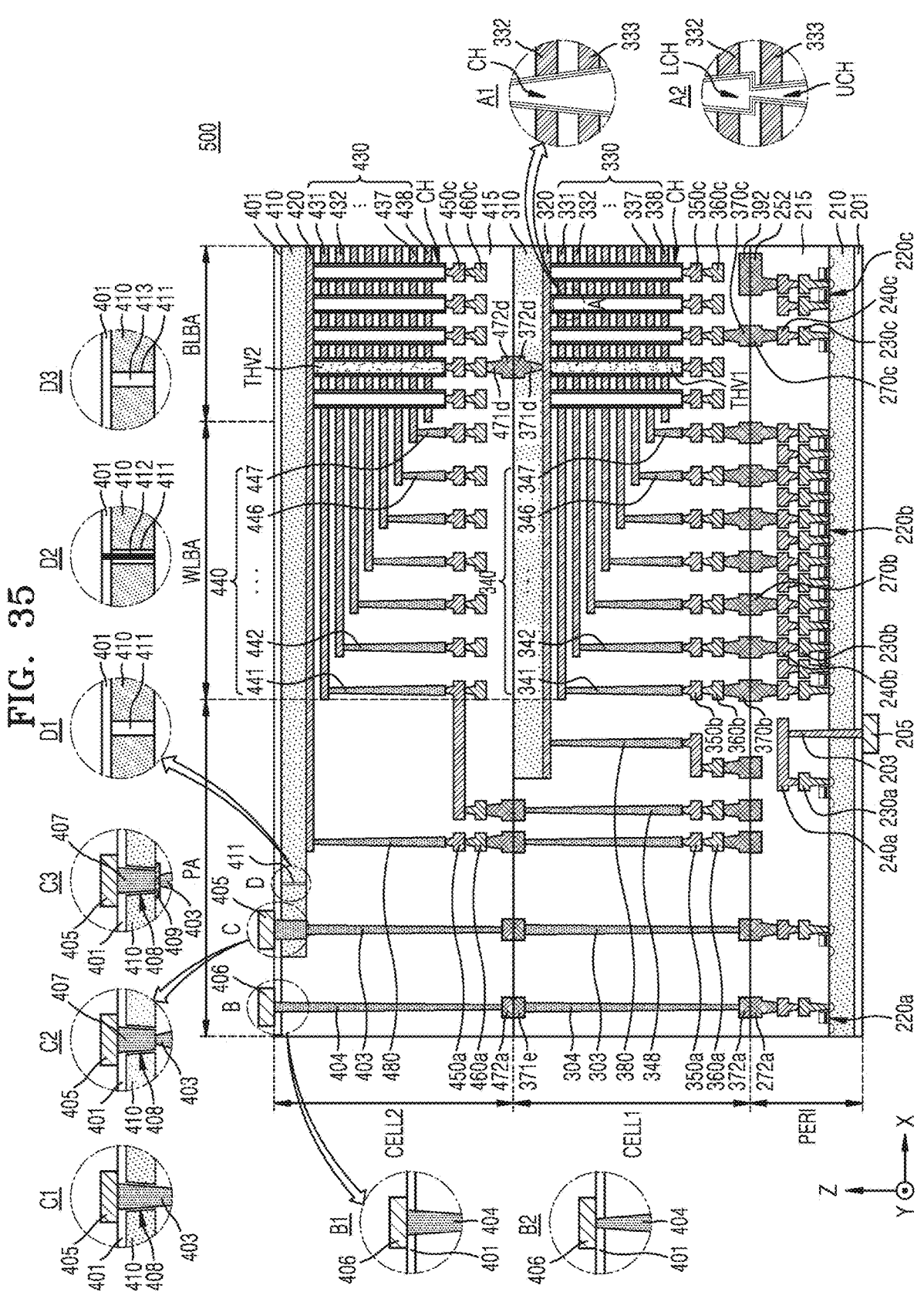
FIG. 35 is a cross-sectional view of a memory device having a bonding vertical NAND (B-VNAND) structure, according to an embodiment.

FIG. 35 is a view illustrating a memory device 500 according to some embodiments of inventive concepts.

Referring to FIG. 35, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 500 may include the at least one upper chip including the cell region. For example, as illustrated in FIG. 35, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 35. However, embodiments of inventive concepts are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity, and the second metal lines 240a, 240b and 240c may be formed of copper having a relatively low electrical resistivity.

The first metal lines 230a, 230b and 230c and the second metal lines 240a, 240b and 240c are illustrated and described in the present embodiments. However, embodiments of inventive concepts are not limited thereto. In certain embodiments, at least one or more additional metal lines may further be formed on the second metal lines 240a, 240b and 240c. In this case, the second metal lines 240a, 240b and 240c may be formed of aluminum, and at least some of the additional metal lines formed on the second metal lines 240a, 240b and 240c may be formed of copper having an electrical resistivity lower than that of aluminum of the second metal lines 240a, 240b and 240c.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (e.g., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (e.g., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350*c* and a second metal line 360*c* in the bit line bonding region BLBA. For example, the second metal line 360*c* may be a bit line and may be connected to the channel structure CH through the first metal line 350*c*. The bit line 360*c* may extend in a first direction (e.g., a Y-axis direction) parallel to the top surface of the second substrate 310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350*c* and the second metal line 360*c*. As a length of a channel increases, due to characteristics of manufacturing processes, it may be difficult to form a channel having a substantially uniform width. The memory device 500 according to the present embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

Meanwhile, the number of the lower word lines 331 and 332 penetrated by the lower channel LCH is less than the number of the upper word lines 333 to 338 penetrated by the upper channel UCH in the region 'A2'. However, embodiments of inventive concepts are not limited thereto. In certain embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 35, the first through-electrode THV1 may penetrate the common source line 320 and the plurality of word lines 330. In certain embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372*d* and a second through-metal pattern 472*d*. The first through-metal pattern 372*d* may be formed at a bottom end of the first upper chip including the first cell region CELL1, and the second through-metal pattern 472*d* may be formed at a top end of the second upper chip including the second cell region CELL2. The first through-electrode THV1 may be electrically connected to the first metal line 350*c* and the second metal line 360*c*. A lower via 371*d* may be formed between the first through-electrode THV1 and the first through-metal pattern 372*d*, and an upper via 471*d* may be formed between the second through-electrode THV2 and the second through-metal pattern 472*d*. The first through-metal pattern 372*d* and the second through-metal pattern 472*d* may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360*c* may be electrically connected to a page buffer included in the peripheral circuit region PERI. For example, some of the circuit elements 220*c* of the peripheral circuit region PERI may constitute the page buffer, and the bit line 360*c* may be electrically connected to the circuit elements 220*c* constituting the page buffer through an upper bonding metal pattern 370*c* of the first cell region CELL1 and an upper bonding metal pattern 270*c* of the peripheral circuit region PERI.

Referring continuously to FIG. 35, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350*b* and second metal lines 360*b* may be sequentially connected onto the cell contact plugs 340 connected to the word lines 330. In the word line bonding region WLBA, the cell contact plugs 340 may be connected to the peripheral circuit region PERI through upper bonding metal patterns 370*b* of the first cell region CELL1 and upper bonding metal patterns 270*b* of the peripheral circuit region PERI.

The cell contact plugs 340 may be electrically connected to a row decoder included in the peripheral circuit region PERI. For example, some of the circuit elements 220*b* of the peripheral circuit region PERI may constitute the row decoder, and the cell contact plugs 340 may be electrically connected to the circuit elements 220*b* constituting the row decoder through the upper bonding metal patterns 370*b* of the first cell region CELL1 and the upper bonding metal patterns 270*b* of the peripheral circuit region PERI. In some embodiments, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected to each other by the bonding method. The upper bonding metal patterns 370*b* and the upper bonding metal patterns 270*b* may be formed of aluminum, copper, or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected to each other by the bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450*a* and a second metal line 460*a* may be sequentially stacked on the common source line contact plug 480 of the second cell region CELL2.

Input/output pads 205, 405 and 406 may be disposed in the external pad bonding region PA. Referring to FIG. 35, a lower insulating layer 201 may cover a bottom surface of the first substrate 210, and a first input/output pad 205 may be formed on the lower insulating layer 201. The first input/output pad 205 may be connected to at least one of a plurality of the circuit elements 220*a* disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering a bottom surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220*a* disposed in the peripheral circuit region PERI through second input/output contact plugs 403 and 303, and the third input/output pad 406 may be connected to at least one of the plurality of circuit elements 220*a* disposed in the peripheral circuit region PERI through third input/output contact plugs 404 and 304.

In some embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, the third input/output contact plug 404 may be formed by at least one of various processes.

In some embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In certain embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In certain embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/ output contact plug 403 and the second input/output pad 405 may be realized by various methods.

In some embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, embodiments of inventive concepts are not limited thereto, and in certain embodiments, the diameter of the second input/output contact plug 403 may become progressively less toward the second input/output pad 405.

In certain embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In certain embodiments illustrated in a region 'C3', a stopper 409 may further be formed on a top end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371e or may become progressively greater toward the lower metal pattern 371c.

Meanwhile, in some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some embodiments, as illustrated in a region 'D1', the slit 411 may be formed to penetrate the third substrate 410. For example, the slit 411 may be used to prevent the third substrate 410 from being finely cracked when the opening 408 is formed. However, embodiments of inventive concepts are not limited thereto, and in certain embodiments, the slit 411 may be formed to have a depth ranging from about 60% to about 70% of a thickness of the third substrate 410.

In certain embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In certain embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

Meanwhile, in certain embodiments, the first to third input/output pads 205, 405 and 406 may be selectively formed. For example, the memory device 500 may be realized to include only the first input/output pad 205 disposed on the first substrate 210, to include only the second input/output pad 405 disposed on the third substrate 410, or to include only the third input/output pad 406 disposed on the upper insulating layer 401.

In some embodiments, at least one of the second substrate 310 of the first cell region CELL1 and the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a bottom surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a bottom surface of the common source line 420 or a conductive layer for connection may be formed.

The embodiments described above with reference to FIGS. 1 to 34 may also be applied to the present embodiment. In detail, the first cell region CELL1 and the second cell region CELL2 may each include a plurality of dummy contact plugs or dummy contacts and/or contact plugs or contacts, and an interlayer insulation layer of the first cell region CELL1 and/or the interlayer insulation layer 415 of the second cell region CELL2 may be implemented by a material containing hydrogen ions and may be used as hydrogen-providing insulation layers. Therefore, through an alloying process, hydrogen ions in the interlayer insulation layer of the first cell region CELL1 may diffuse toward the word lines 330 and the channel structures CH of the first cell region CELL1, and hydrogen ions in the interlayer insulation layer 415 of the second cell region CELL2 may diffuse toward the word lines 430 and the channel structures CH of the second cell region CELL2. Therefore, in the memory device 500 having a B-VNAND structure, even when the peripheral circuit region PERI overlaps the first cell region CELL1 and the second cell region CELL2 in the vertical direction Z, cell characteristics of memory cells may be improved by providing hydrogen ions in interlayer insulation layers of the first cell region CELL1 and the second cell region CELL2 to the channel structures CH.

Figure 36:
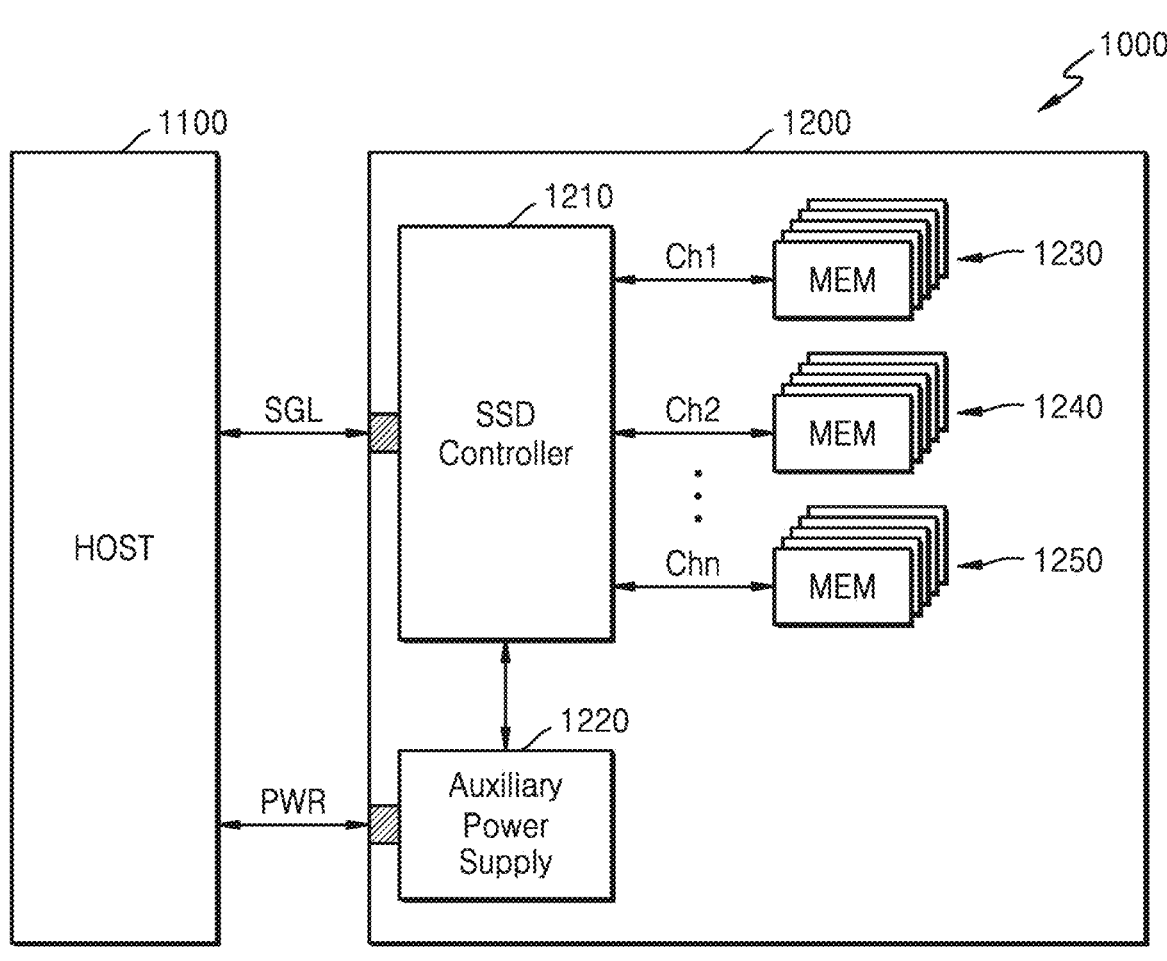
FIG. 36 is a diagram showing a solid state drive (SSD) including a memory device according to an embodiment.

FIG. 36 is a block diagram showing an example in which a memory device according to embodiments is applied to a solid state drive (SSD) system 1000.

Referring to FIG. 36, the SSD system 1000 may include a host 1100 and an SSD 1200. The SSD 1200 exchanges signals with the host 1100 through a signal connector and receives power through a power connector. The SSD 1200 may include an SSD controller 1210, an auxiliary power supply device 1220, and a plurality of memory devices 1230, 1240, and 1250. The memory devices 1230, 1240, and 1250 may be vertically stacked NAND flash memory devices. Here, the SSD 1200 may be implemented according to the embodiments described above with reference to FIGS. 1 to 35.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some embodiments of inventive concept have been particularly shown and described with reference to embodiments thereof, it will be understood that various changes in form and details may be made therein without departing from the spirit and scope of the following claims.

What is claimed is:

1. A non-volatile memory device comprising:
a memory cell region including a plurality of channel structures extending in a vertical direction, a first metal layer over the plurality of channel structures, a first capping layer over the first metal layer, a first upper insulation layer over the first capping layer, and at least one first dummy contact penetrating through the first capping layer; and
a peripheral circuit region below the memory cell region in the vertical direction, wherein
the first metal layer includes a plurality of bit lines and at least one dummy bit line,
the plurality of bit lines are respectively connected to the plurality of channel structures,
the at least one first dummy contact is on the at least one dummy bit line and provides a migration path for hydrogen ions in the first upper insulation layer.

2. The non-volatile memory device of claim 1, wherein the at least one dummy bit line comprises a plurality of dummy bit lines each extending in a first direction and spaced apart from one another in a second direction, and the at least one first dummy contact comprises a first dummy contact over the plurality of dummy bit lines.

3. The non-volatile memory device of claim 1, wherein the at least one dummy bit line comprises a plurality of dummy bit lines each extending in a first direction and spaced apart from one another in a second direction, and the at least one first dummy contact comprises a first dummy contact over a first dummy bit line from among the plurality of dummy bit lines.

4. The non-volatile memory device of claim 1, wherein the memory cell region further comprises a second metal layer over the first capping layer, a second capping layer over the second metal layer, a second upper insulation layer over the second capping layer, and at least one second dummy contact over the at least one first dummy contact, and
the at least one second dummy contact penetrates through the second capping layer and provides a migration path for hydrogen ions in the second upper insulation layer.

5. The non-volatile memory device of claim 4, wherein the second metal layer comprises at least one metal pattern on the at least one first dummy contact, and the at least one second dummy contact is on the at least one metal pattern.

6. The non-volatile memory device of claim 1, wherein the at least one dummy bit line comprises a plurality of dummy bit lines each extending in a first direction and spaced apart from one another in a second direction, the first metal layer further comprises a dummy pattern connected to the plurality of dummy bit lines and having a certain length in the second direction, and the at least one first dummy contact comprises a first dummy contact on the dummy pattern.

7. The non-volatile memory device of claim 1, wherein the first metal layer further comprises a common source line tapping wire and a floating metal pattern, the common source line tapping wire is adjacent to the at least one dummy bit line and extends in a first direction, the floating metal pattern is adjacent to the common source line tapping wire in the first direction, and the at least one first dummy contact comprises a first dummy contact on the floating metal pattern.

8. The non-volatile memory device of claim 1, wherein the first metal layer further comprises a common source line tapping wire adjacent to the at least one dummy bit line and extending in a first direction, the memory cell region further comprises an upper substrate, a common source line on the upper substrate, and a through electrode connecting the common source line tapping wire to the common source line, and the through electrode extends in the vertical direction.

9. A non-volatile memory device comprising:
a memory cell region including a plurality of channel structures extending in a vertical direction, a first metal layer over the plurality of channel structures, a first capping layer over the first metal layer, a first upper insulation layer over the first capping layer, at least one first contact, and at least one second contact; and
a peripheral circuit region below the memory cell region in the vertical direction, wherein
the first metal layer includes a plurality of bit lines each extending in a first direction and spaced apart from one another in a second direction, a common source line tapping wire extending in the first direction and configured to have a common source line voltage applied thereto, and a node wire spaced apart from the common source line tapping wire in the first direction and configured to have a bias voltage applied thereto,
the at least one first contact is on the common source line tapping wire and penetrates through the first capping layer,
the at least one second contact on the node wire and penetrates through the first capping layer, and
the at least one first contact and the at least one second contact provide a migration path for hydrogen ions in the first upper insulation layer.

10. The non-volatile memory device of claim 9, wherein the memory cell region further comprises a second metal layer over the first upper insulation layer, the second metal layer includes a first metal line and a second metal line, the first metal line is on the at least one first contact and configured to have the common source line voltage applied thereto, and the second metal line is on the at least one second contact and configured to have the bias voltage applied thereto.

11. The non-volatile memory device of claim 10, wherein the first metal line and the second metal line extend in the second direction and are spaced apart from each other in the first direction.

12. The non-volatile memory device of claim 10, wherein the memory cell region further comprises at least one dummy contact on the common source line tapping wire, and the at least one dummy contact penetrates through the first capping layer and provides a migration path for the hydrogen ions in the first upper insulation layer.

13. The non-volatile memory device of claim 9, wherein the memory cell region further comprises an upper substrate, a common source line on the upper substrate, and a through electrode connecting the common source line tapping wire to the common source line, and the through electrode extends in the vertical direction.

14. The non-volatile memory device of claim 13, wherein the memory cell region further comprises a dummy channel structure extending in the vertical direction from the upper substrate and connected to the node wire.

15. The non-volatile memory device of claim 9, wherein the bias voltage corresponds to a ground voltage.

16. A non-volatile memory device comprising:

a memory cell region including an upper substrate, a plurality of gate electrodes stacked on the upper substrate in a vertical direction, and a plurality of channel structures extending in the vertical direction on the upper substrate; and a peripheral circuit region below the memory cell region in the vertical direction, wherein the peripheral circuit region includes a lower substrate, a first lower insulation layer on the lower substrate, a capping layer over the first lower insulation layer, and at least one via between the capping layer and the upper substrate, and the at least one via penetrates through the capping layer and provides a migration path for hydrogen ions in the first lower insulation layer.

17. The non-volatile memory device of claim 16, wherein the peripheral circuit region further comprises a lower metal layer, and the capping layer is on the lower metal layer.

18. The non-volatile memory device of claim 17, wherein the at least one via penetrates through the capping layer and is connected to the lower metal layer.

19. The non-volatile memory device of claim 17, wherein the at least one via penetrates through the capping layer and is connected to the first lower insulation layer.

20. The non-volatile memory device of claim 17, wherein the peripheral circuit region further comprises a lower dummy metal layer, the capping layer is on the lower metal layer and the lower dummy metal layer, and the at least one via penetrates through the capping layer and is connected to the lower dummy metal layer.

* * * * *